United States Patent
Lee et al.

(10) Patent No.: US 6,781,193 B2
(45) Date of Patent: Aug. 24, 2004

(54) NON-VOLATILE MEMORY DEVICE HAVING FLOATING TRAP TYPE MEMORY CELL AND METHOD OF FORMING THE SAME

(75) Inventors: Chang-Hyun Lee, Kyunggi-do (KR); Jung-Dal Choi, Kyunggi-do (KR); Wang-Chul Shin, Kyunggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/215,504

(22) Filed: Aug. 9, 2002

(65) Prior Publication Data

US 2003/0030097 A1 Feb. 13, 2003

(30) Foreign Application Priority Data

Aug. 9, 2001 (KR) ........................................ 2001-47944

(51) Int. Cl.[7] .............................................. H01L 29/792
(52) U.S. Cl. ........................ 257/326; 257/324; 257/314
(58) Field of Search .............................. 257/326, 324, 257/314

(56) References Cited

U.S. PATENT DOCUMENTS

| | | | |
|---|---|---|---|
| 5,663,084 A | 9/1997 | Yi et al. | |
| 5,751,037 A | 5/1998 | Aozasa et al. | |
| 6,023,085 A | 2/2000 | Fang | |
| 6,074,915 A | 6/2000 | Chen et al. | |
| 6,087,211 A | 7/2000 | Kalnitsky et al. | |
| 6,130,168 A | 10/2000 | Chu et al. | |
| 6,197,639 B1 | 3/2001 | Lee et al. | |
| 6,204,159 B1 | 3/2001 | Chang et al. | |
| 6,436,768 B1 * | 8/2002 | Yang et al. | 438/266 |
| 6,468,865 B1 * | 10/2002 | Yang et al. | 438/262 |

FOREIGN PATENT DOCUMENTS

| | | |
|---|---|---|
| EP | 1 014 441 A1 | 6/2000 |
| WO | WO 00/35005 | 6/2000 |

* cited by examiner

*Primary Examiner*—David Nelms
*Assistant Examiner*—Tu-Tu Ho
(74) *Attorney, Agent, or Firm*—Marger Johnson & McCollom, P.C.

(57) ABSTRACT

A non-volatile memory device includes a cell region having a memory gate pattern with a charge storage layer, and a peripheral region having a high-voltage-type gate pattern, a low-voltage-type gate pattern, and a resistor pattern. To fabricate the above memory device, a device isolation layer is formed in a substrate. Gate insulating layers having difference thickness are formed in low-and high-voltage regions of the peripheral region, respectively. A first conductive layer is formed over substantially the entire surface of a gate insulating layer in the peripheral region. A triple layer including a tunneling insulating layer, a charge storage layer, and a blocking insulating layer and a second conductive layer are sequentially formed over substantially the entire surface of the substrate including the first conductive layer.

27 Claims, 40 Drawing Sheets

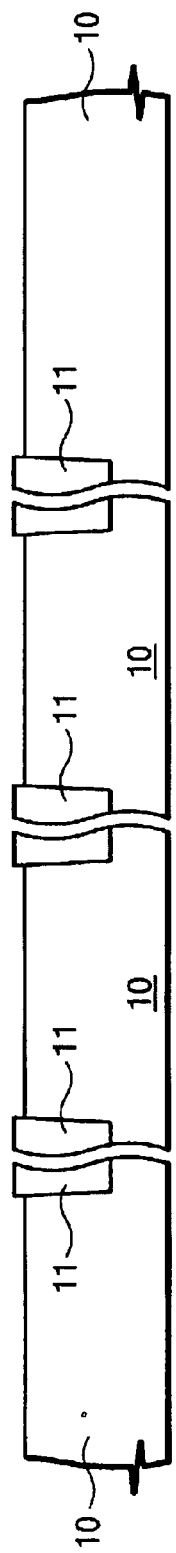
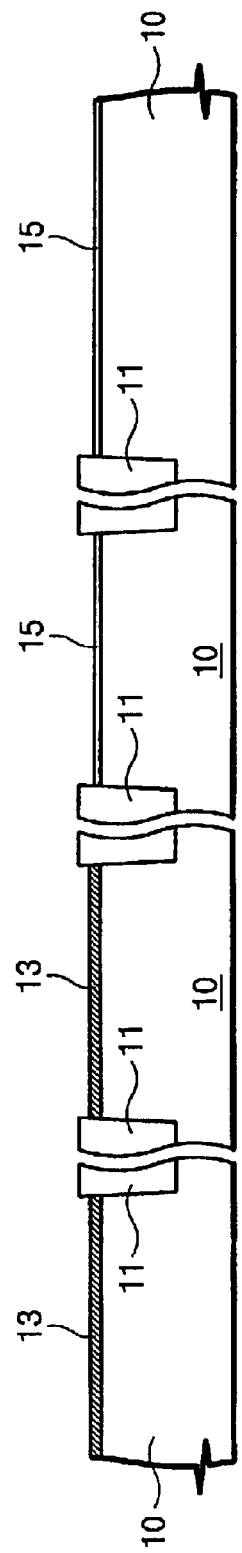

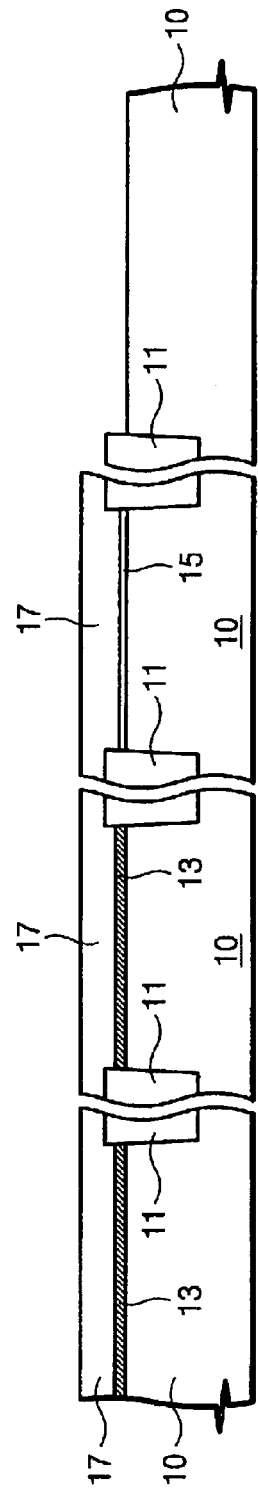
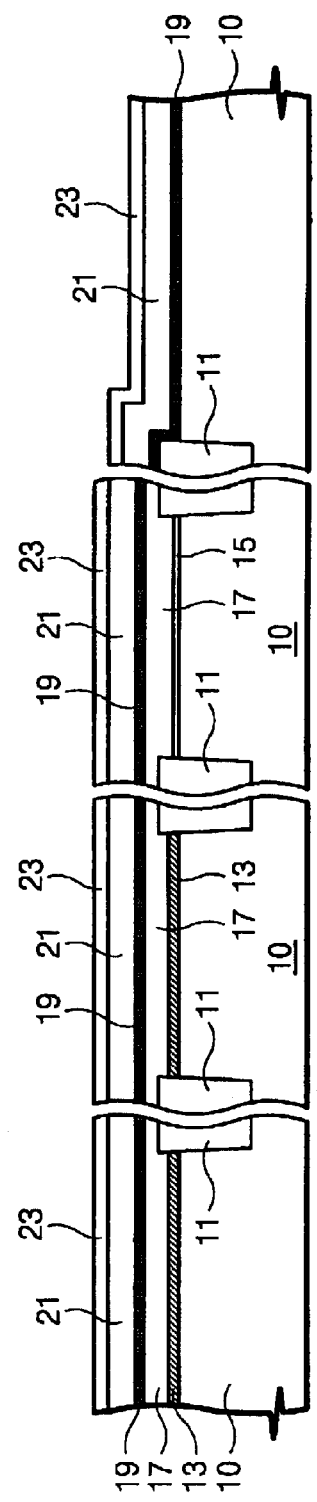

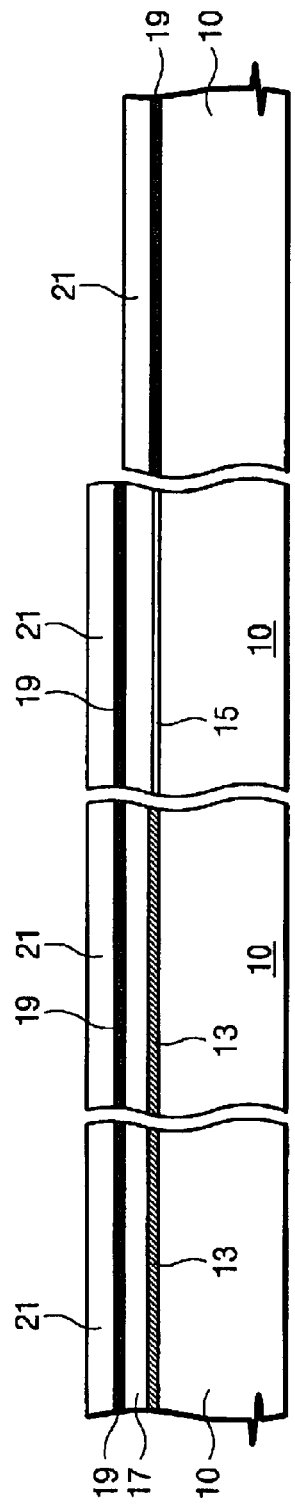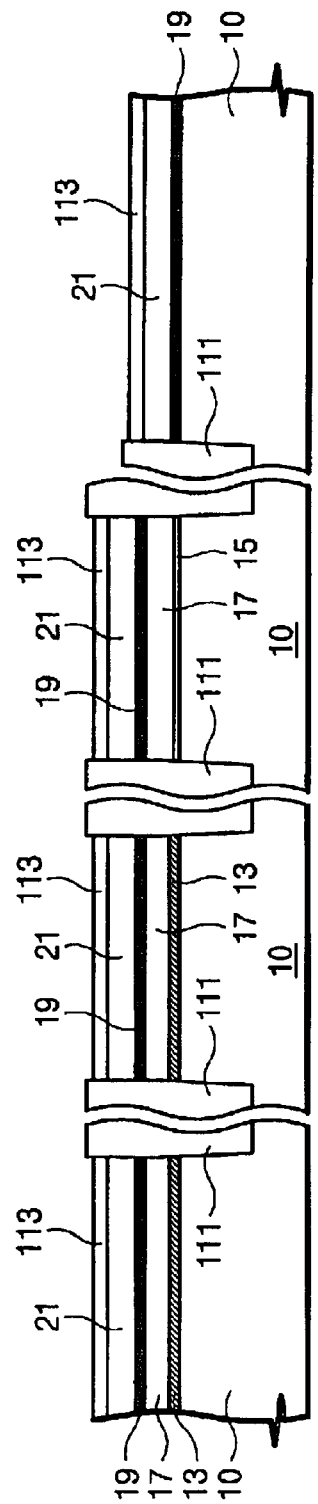

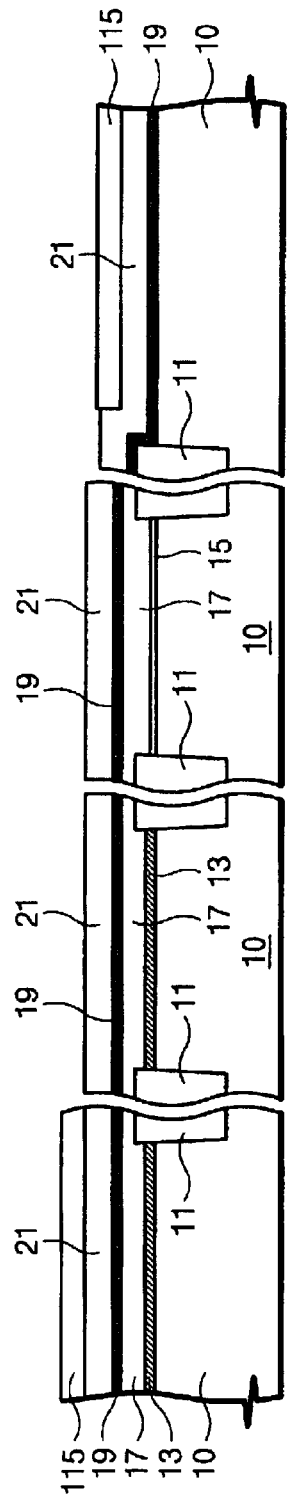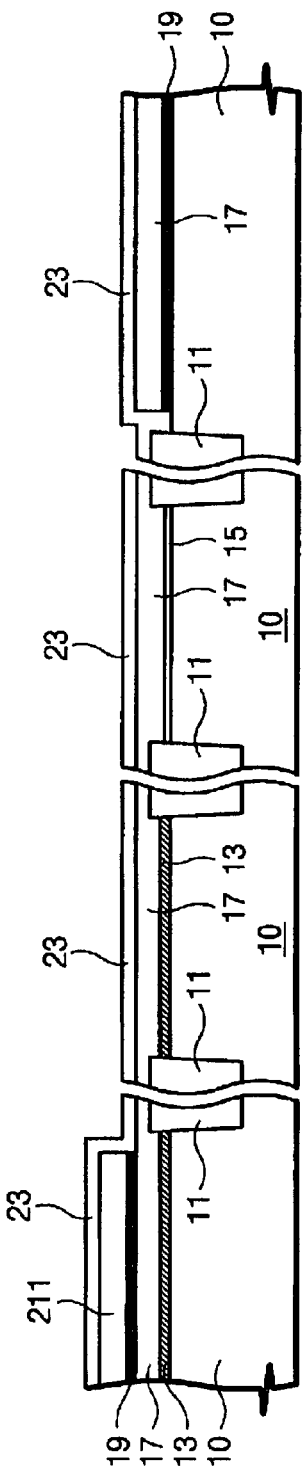

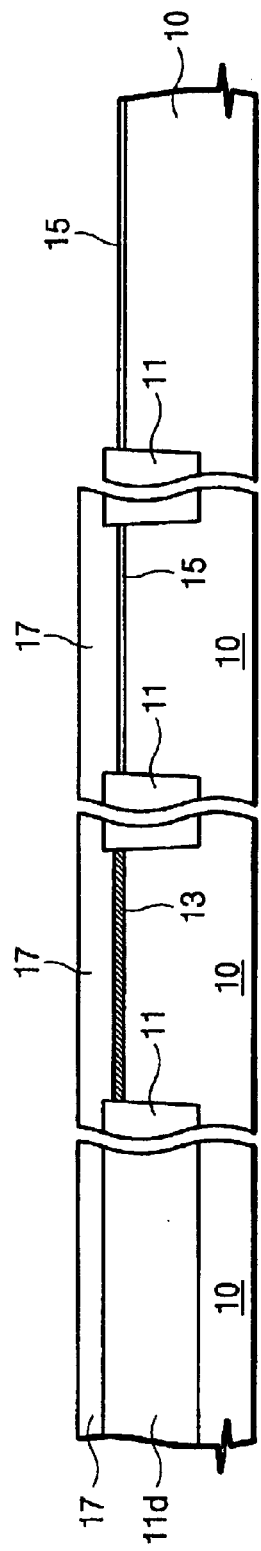
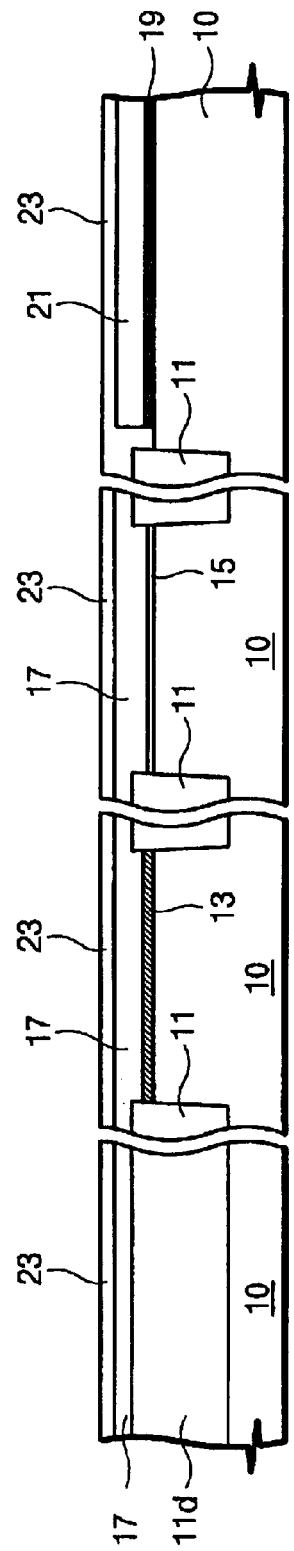

NON-VOLATILE MEMORY DEVICE HAVING FLOATING TRAP TYPE MEMORY CELL AND METHOD OF FORMING THE SAME

RELATED APPLICATION

This application relies for priority upon Korean Patent Application No. 2001-47944, filed on Aug. 9, 2001, the contents of which are herein incorporated by this reference in their entirety.

FIELD OF THE INVENTION

The present invention generally relates to a non-volatile semiconductor memory device and a method of forming the same. More specifically, the invention is directed to a semiconductor memory device having a floating trap-type memory cell and a method of forming the same.

BACKGROUND OF THE INVENTION

A non-volatile memory device such as a flash memory device continuously holds data until it is erased. Therefore, unlike a volatile memory device such as a normal DRAM, the non-volatile memory device does not require refresh-related circuitry and can save power consumption.

However, the non-volatile memory device needs a high voltage for writing/erasing data and an extra storage for holding data. This complicates the structure and forming processes. For example, the non-volatile memory device may additionally need a charge storage for reliably preserving data and a voltage drop resistor for driving high and low voltage areas from a single power source.

Based upon a structure, memory cells of the non-volatile memory device type are classified into a floating gate type memory cell and a floating trap-type memory cell. In the floating trap-type memory cell, programming can be carried out by storing a charge in a trap formed in a non-conducive charge storage layer between a gate electrode and a semiconductor substrate. To form a floating trap, a tunneling insulating layer and a blocking insulating layer are formed on/beneath a silicon nitride layer acting as a charge storage layer.

FIG. 1 is a cross-sectional view showing a typical SONOS (silicon oxide nitride oxide semiconductor) structure of the floating trap-type memory device. A memory cell has a gate pattern and impurity diffusion layers. A gate pattern is formed by sequentially stacking a tunneling insulating layer 20, a charge storage layer 22, a blocking insulating layer 24, and a gate electrode 27 on an active region of a semiconductor substrate 10. An impurity diffusion layer 28 is formed in an active region on both sides of the gate pattern. Typically, the tunneling insulating layer 20 is made of thermal oxide and the charge storage layer 22 is made of silicon nitride.

In a non-volatile semiconductor memory device having a floating gate, a gate insulating layer of a memory cell conventionally has the same thickness as a gate insulating layer for forming a transistor of a low-voltage area in a peripheral circuit region. However, a tunneling insulating layer of the floating trap-type memory cell conventionally is different, in suitable thickness, from a gate insulating layer for forming a transistor of a lower voltage area in a peripheral circuit region. Therefore, the process for fabricating a non-volatile semiconductor device having the floating trap-type memory cell is more complex than the process for fabricating a non-volatile semiconductor device having the floating gate-type memory cell.

SUMMARY OF THE INVENTION

The present invention alleviates the complexity of the process for fabricating a non-volatile semiconductor memory device having a floating trap-type memory cell.

Therefore, the present invention provides a non-volatile semiconductor memory device having a floating trap-type memory cell that achieves process simplification and enhanced reliability, and a method of fabricating the same.

Furthermore, the present invention provides a non-volatile semiconductor memory device with improved efficiency in conveying a drive signal, and a method of fabricating the same.

According to one aspect of the present invention, a non-volatile semiconductor memory device comprises a cell gate pattern of a cell array region, a high-voltage-type gate pattern of a peripheral high-voltage region, and a low-voltage-type gate pattern of a peripheral low voltage region on a semiconductor substrate. The high-voltage type gate pattern has a gate insulating layer for a high voltage, a first conductive layer, a triple layer, and a second conductive layer. The cell gate pattern has only the triple layer and the second conductive layer. The triple layer includes a tunneling insulating layer, a charge storage layer, and a blocking insulating layer. The low-voltage-type gate pattern has a gate insulating layer for a low voltage, the first conductive layer, the triple layer, and the second conductive layer.

The non-volatile memory device further comprises a line-type resistor pattern in a resist region. The resistor pattern has at least the first conductive layer formed on a gate insulating layer for electrical isolation from the substrate. The first conductive layer is made of doping-controlled polysilicon, acting as a resist layer. The insulating layer is a trench-type device isolation layer or an insulating layer for a high voltage. The resistor pattern has a contact region including the gate insulating layer for a high voltage and the first conductive layer and a line region including the gate insulating layer for a high voltage, the first conductive layer, the triple layer, and the second conductive layer. A contact formed over the resistor pattern is not electrically connected to the second conductive layer in the contact region. The cell gate pattern, the high-voltage-type gate pattern, and the low-voltage-type gate pattern have an insulating spacer on their sidewalls.

The second conductive layer is a dual layer comprising a lower layer of polysilicon and an upper layer of metal silicide.

A region of each of the gate pattern and the resistor pattern may have a contact for coupling to an upper circuit. That is, a contact plug may be made over a part of the pattern. When the second conductive layer and the triple layer are removed in a part of the contact region in the respective low-and high-voltage-type gate patterns, a butting contact is formed to concurrently connect to the first and second conductive layers in the contact region. If the second conductive layer and the triple layer are removed in at least the contact region of the resistor pattern and a contact plug is formed, only the first conductive layer of the line type resistor pattern is used as a resist layer.

Further, a top surface level of the triple layer is lower than a top surface level of a trench type device isolation layer formed at the substrate in the cell gate pattern. A bottom surface level of the triple layer is higher than a top surface level of the trench type device isolation layer in peripheral high-and low-voltage-type device regions. A top surface level of the lower conductive layer of the gate pattern is lower than a top surface level of the device isolation layer in a region where the gate pattern for a memory component, the high-voltage-type gate pattern, and the low-voltage-type gate pattern are formed.

According to another embodiment of the present invention, a non-volatile memory device is similar to the non-volatile memory device of the first embodiment. However, a triple layer is not formed and a simple contact is formed instead of a butting contact. More specifically, a high-voltage-type gate pattern has a gate insulating layer for a high voltage, a first conductive layer, and a high-conductivity layer. A cell gate pattern has a triple layer, a second conductive layer, and the high-conductivity layer, the triple layer including a tunneling insulating layer, a charge storage layer, and a blocking insulating layer. A low-voltage-type gate pattern has a gate insulating layer for a low voltage, the first conductive layer, and the high-conductivity layer. The high-conductivity layer is a metal-containing single layer or a dual layer include a lower layer of polysilicon and an upper layer of metal.

In this non-volatile semiconductor memory device, a line-type resistor pattern is formed. The resistor pattern of this embodiment is identical to that of the first embodiment. Each of the gate patterns and the resistor pattern may have a contact coupling to an upper circuit. However, in a layer structure of the resistor pattern, a contact forming region has a resist layer that is separated from the substrate by an insulating layer. The resistor layer is formed of a first conductive layer. If the high-conductivity layer is formed of a dual layer having a lower layer of polysilicon and an upper layer of metal silicide, the resistor layer may be formed of a combination layer of the first conductive layer and the polysilicon layer of the high-conductivity layer. The line region of the resistor pattern, except the contact region, has the same structure as the contact region or a structure where the triple layer, the second conductive layer, and the low resist conductive layer are sequentially stacked on the resist layer.

Further, a top surface level of the triple layer is lower than a top surface level of the trench type device isolation layer formed at the substrate in the cell array region. A top surface level of the first conductive layer is higher than a top surface level of the trench type device isolation layer in the peripheral high-and low-voltage type regions. In the cell array region, a top surface level of the trench type device isolation layer formed on the substrate is higher than a top surface level of the second conductive layer and is lower than a top surface level of the polysilicon layer of the high-conductivity layer. In the peripheral high-and low-voltage type regions, a top surface level of the trench-type device isolation layer is higher than a top surface level of the first conductive layer and is lower than a top surface level of the polysilicon layer of the high-conductivity layer.

In this embodiment, the tunneling insulating layer of the triple layer is conventionally made of thin silicon thermal oxide. The charge storage layer and the blocking insulating layer thereof are conventionally made of silicon nitride and silicon oxide respectively by a CVD technique. the gate patterns have an insulating spacer that is typically made of silicon nitride on their sidewall.

According to still another aspect of the present invention, a method of fabricating a non-volatile semiconductor memory device comprises forming a device isolation layer in a substrate, forming a low-voltage gate insulating layer in at least a peripheral low-voltage region of the substrate, and forming a high-voltage gate insulating layer in at least a peripheral high voltage region of the substrate, stacking a first conductive layer over substrate, performing a patterning process to remove the first conductive layer in a cell array region and to expose the substrate, and sequentially forming a triple layer and a second conductive layer over substantially the entire surface of the exposed substrate in the cell array region. The triple layer includes a tunneling insulating layer, a charge storage layer, and a blocking insulating layer.

In the cell array region, the tunneling insulating layer, the peripheral low-voltage gate insulating layer, and the peripheral high-voltage gate insulating layer may be differently formed. The structure of the gate pattern may be different from that of the peripheral high-and low-voltage-type gate patterns.

The present invention can be applied to cases wherein a device isolation layer is first formed as well as cases wherein one layer of the gate pattern is formed and then a trench-type device isolation layer is formed. Further, the present invention can be applied to cases wherein peripheral low-and high-voltage-type gate patterns having an insulating layer therein are formed over a butting contact, as well as cases wherein a simple contact connected to an uppermost layer is formed without the insulating layer. The present invention can be in cases wherein a resist layer of a resistor pattern is formed over a device isolation layer, as well as cases wherein the resist layer thereof is formed over an insulating layer such as a high-voltage gate insulating layer.

BRIEF DESCRIPTION OF THE DRAWINGS

FIG. 2 through FIG. 8 are cross-sectional views of one example in which a device isolation layer is formed, and then a gate pattern is formed with a butting contact formed in a peripheral part, according to the present invention.

FIG. 12 through FIG. 17 are processing cross-sectional views of a second embodiment of the present invention.

FIG. 21 through FIG. 25 are processing cross-sectional views of a third embodiment of the present invention.

FIG. 38 through FIG. 44 are processing cross-sectional views of a sixth embodiment of the present invention.

DESCRIPTION OF THE PREFERRED EMBODIMENTS

Figure 1:
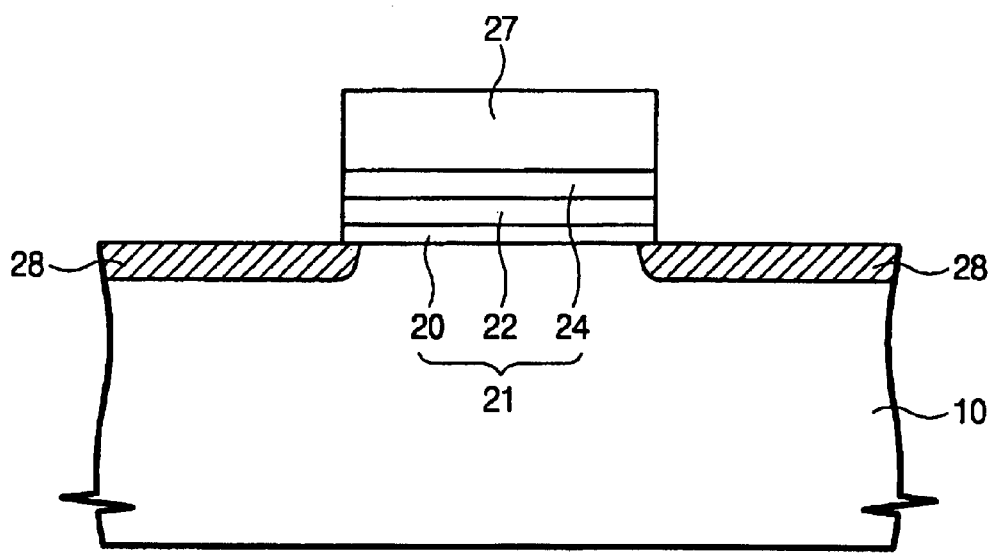
FIG. 1 is a cross-sectional view of a conventional structure of a floating trap type unit component.

In the following detailed description of the preferred embodiments, reference is made to the accompanying drawings which form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention.

Embodiment 1

Referring to FIG. 2, the device isolation is made on a silicon substrate 10. Four left-to-right regions represent a resistor region, a peripheral high voltage region, a peripheral low voltage region, and a cell array region, in that order. This regional division is identical throughout the drawings. Although a trench-type device isolation layer 11 is illustrated in FIG. 2, a LOCOS-type device isolation layer may be formed. In case of a shallow trench isolation (STI) technique in used, a top surface of a device isolation layer is identical to or higher than the substrate 10 in elevation. Alternatively, the device isolation layer may be formed on an entire surface of the resist region. In this case, a resistor pattern is formed on the device isolation layer.

Referring to FIG. 3, a thick gate insulating layer 13 for forming a high-voltage device is formed on a substrate 10 where the device isolation layer 11 is formed. By patterning the gate insulating layer 13, thick gate insulating layers in the peripheral low-voltage region and the cell array region are removed and the substrate 10 is exposed. An etch-mask pattern used in the patterning is removed and thermal oxidation is used to form a thin gate insulating layer 15 on a surface of the exposed substrate 10. The thick gate insulating layer 13 still remains in the resist region.

Referring to FIG. 3 and FIG. 4, a first polysilicon layer 17 is formed on an entire surface of a substrate where the thick gate insulating layer 13 and the thin gate insulating layer 15 are formed. A doping concentration of the first polysilicon layer 17 is controlled to accommodate a later-formed resistor. For a patterning process, an etch-mask pattern (not shown) is formed on the first polysilicon layer 17 to expose the cell array region. An etching process is then performed to remove the first polysilicon layer 17 and the thin gate insulating layer 15. The mask pattern is also removed.

Referring to FIG. 5, thermal oxidation is performed in the cell array region. Using a chemical vapor deposition (CVD) technique, a silicon nitride layer and a silicon oxide layer are sequentially stacked to form an ONO (oxide-nitride-oxide) triple layer on a substrate in the cell array region and on the first polysilicon layer in other regions. A second polysilicon layer 21 is formed on the ONO triple layer 21. A metal layer is formed on the second polysilicon layer and then is subjected to annealing to form the metal silicide layer. Alternatively, the metal silicide layer 23 is formed using a CVD technique.

Figure 6:
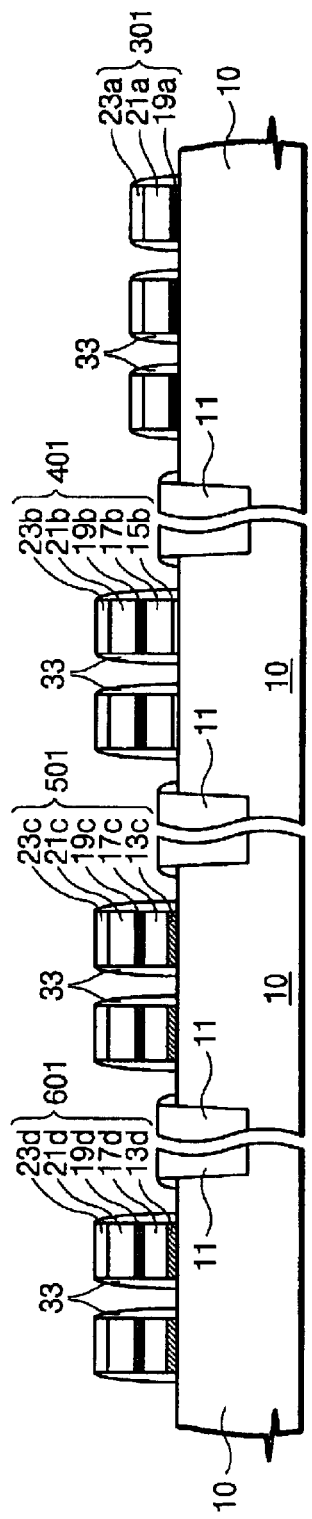

Referring to FIG. 6, gate patterns 301, 401, and 501 are formed in each substrate region by the patterning. As a result of the already-performed process, the structure of the gate pattern may be different in each region. That is, a gate pattern 301 of the cell array region comprises a triple layer 19a, a second polysilicon layer 21a, and a metal silicide layer 23a; a low-voltage-type gate pattern 401 of the peripheral device region comprises a gate insulating layer 15b, a first polysilicon layer 17b, a triple layer 19b, a second polysilicon layer 21b, and a metal silicide layer 23b; and a high-voltage-type gate pattern 501 of the peripheral device region comprises a gate insulating layer 13c, a first polysilicon layer 17c, a triple layer 19c, a second polysilicon layer 21c, and a metal silicide layer 23c. The gate insulating layers 15b and 13c are different in thickness. A resistor pattern 601 of the resist region has the same structure as the high-voltage-type gate pattern 501. Following formation of the gate patterns 301, 401, and 501 and the resistor pattern 601, an insulating spacer 33 is formed on a sidewall of the respective patterns by stacking and anisotropically etching a spacer insulating layer.

Figure 7:
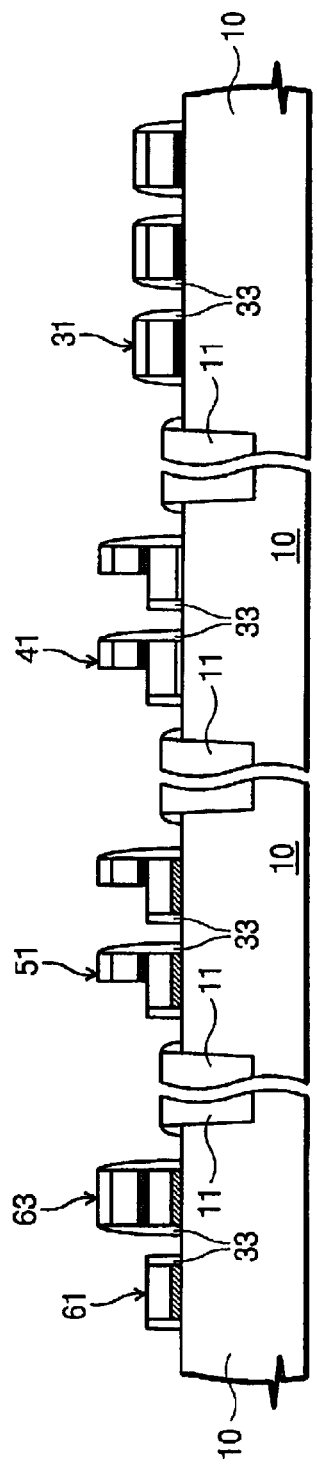

Referring to FIG. 6 and FIG. 7, the patterns 401, 501, and 601 are partially etched. In a contact region 61 of the resistor pattern 601, a triple layer 19c, a second polysilicon layer 21c, and a metal silicide layer 23c are removed to expose a first polysilicon layer 17d. Alternatively, in all regions (i.e., the contact region 61 and a line region 63) of the resistor pattern 601, the triple layer 19c, the second polysilicon layer 21c, and the metal silicide layer 23c are etched. In partial contact regions 51 and 41 of the low-and high-voltage-type gate patterns 501 and 401, the triple layers 19b and 19c, the second polysilicon layers 21b and 21c, and the metal silicide layers 23b and 23c are removed to expose the first polysilicon layers 17b and 17c.

Figure 8:
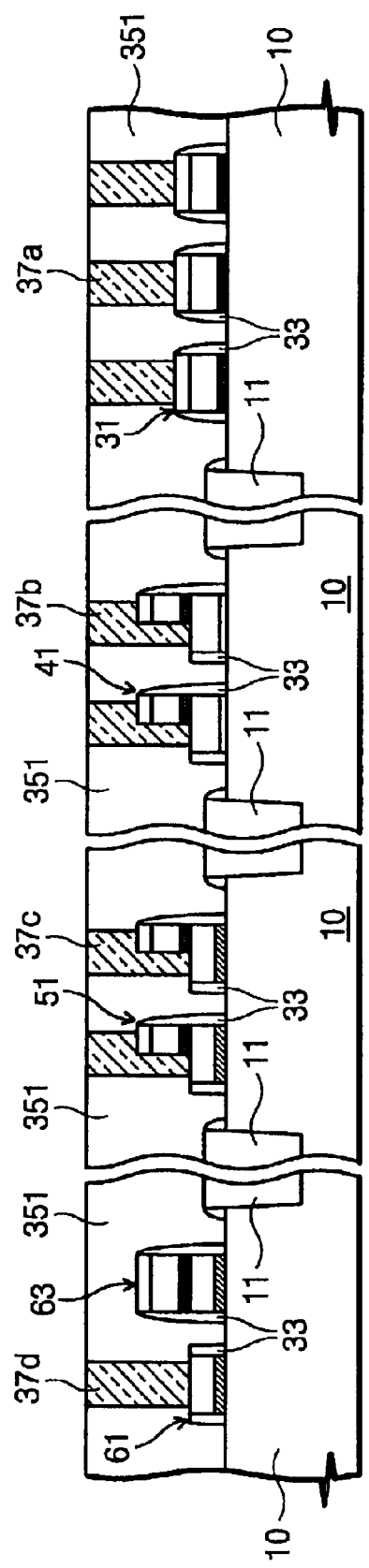

Referring to FIG. 6 and FIG. 8, an interlayer insulating layer 351 is stacked on a substrate including the partially etched gate pattern and the resistor pattern. The interlayer insulating layer 351 is patterned to form a contact hole. In the contact region 61 with-in the resist region, the first polysilicon layer 17d is exposed to a bottom surface of the contact hole. In the contact region 41 and 51 of the peripheral gate pattern, the first polysilicon layers 17b and 17 and the metal silicide layers 23b and 23c are partially exposed. The CVD technique is used to fill the contact hole with tungsten. Although not shown in the figures, thin barrier metal is conventionally stacked on an entire surface of the substrate before stacking the tungsten. The tungsten layer except plugs 37a, 37b, 37c, and 37d filling the contact holes is removed from the substrate by means of a tungsten CMP technique to achieve the contact plug isolation. In subsequent steps, an upper circuit will be formed by stacking and patterning a conductive layer.

Figure 9:
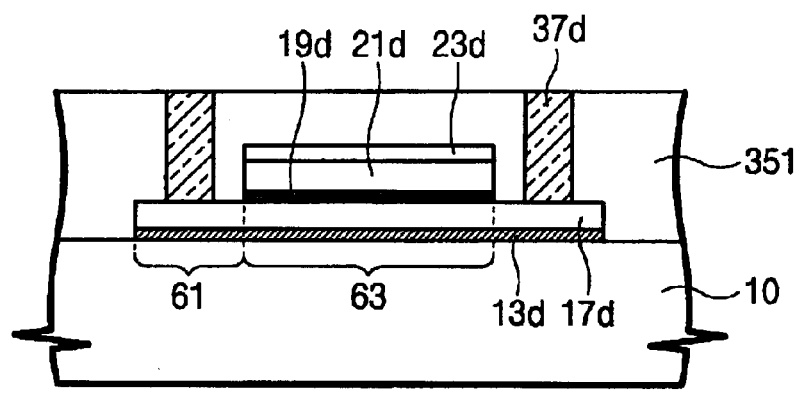
FIG. 9 through FIG. 11 are cross-sectional views taken along a gate pattern and a resistor pattern under a state of FIG. 8.
Figure 10:
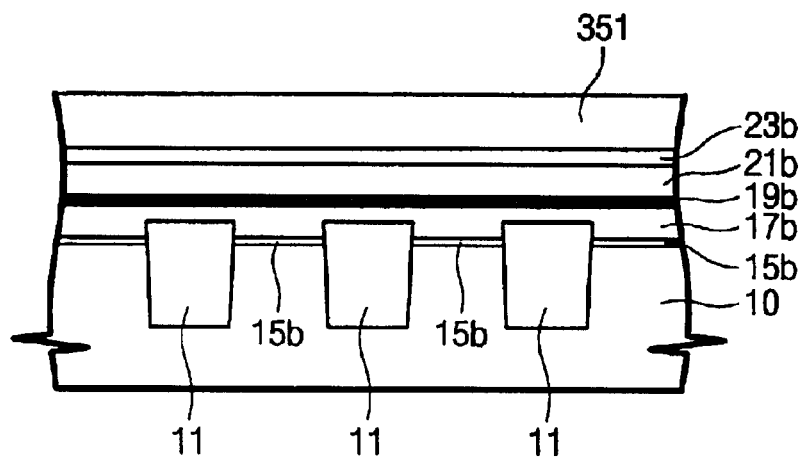
Figure 11:
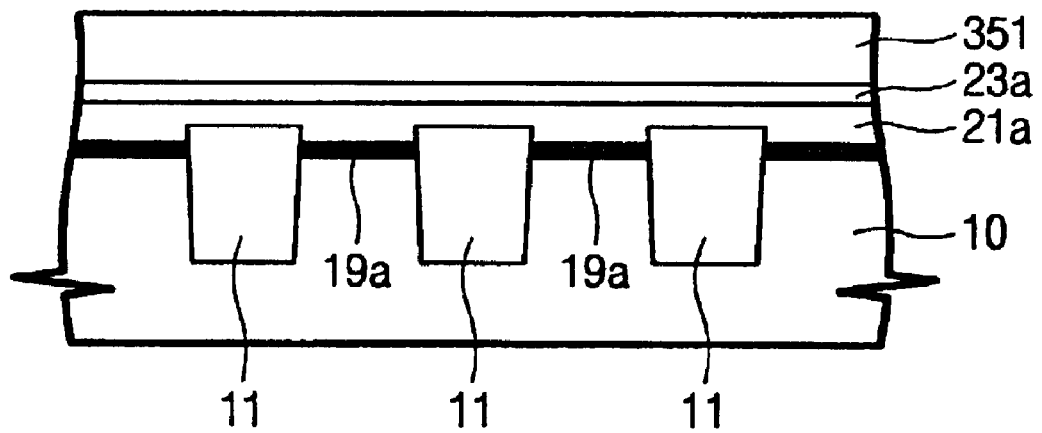

FIG. 9 through FIG. 11 are cross-sectional views taken along a gate pattern plane and a resistor pattern plane under the state of FIG. 8, wherein each of the layers constituting the gate pattern is formed after formation of a shallow trench isolation layer.

Referring to FIG. 9, a resistor pattern is isolated from a substrate 10 by a thick gate insulating layer 13d formed on the substrate 10. If a first polysilicon layer 17d acts as a resistor layer, a resistance of the resistor may be decided in proportion to a distance from a contact plug 37d. In a contact region 61, a triple layer 19d, a second polysilicon layer 21d, and a metal silicide layer 23d are removed so that a contact plug 37d can directly contact the resistor layer. In a line region 63, the second polysilicon layer 21d and the metal silicide layer 23d remain but are isolated from the first polysilicon layer 17d by the triple layer 19d and separated from the contact plug 37d. For that reason, the resistance is not influenced.

FIG. 10 is a cross-sectional view taken along the gate pattern in the peripheral low voltage region. A top surface of a thin gate insulating layer 15b may be lower than top surfaces of device isolation layers 11 in elevation. On the other hand, other layers 17b, 19b, 21b, and 23b constituting the gate pattern are higher than the top surfaces of the device isolation layers 11 in level, and are horizontally extended. Except for a thickness difference between gate insulating layers, a cross section of the peripheral high-voltage region is identical to that of the peripheral low-voltage region.

Referring to FIG. 11, in an active region on the cell array region, an ONO triple layer 19a may be lower than a top surface of a device isolation layer 11 in elevation. On the other hand, a top surface of a second polysilicon layer 21a and a metal silicide layer 23a constituting a gate pattern are higher than the top surface of the device isolation layer in elevation, and are horizontally extended.

Embodiment 2

The second embodiment is an example in which a structure constituting a gate pattern is partially formed, and then a trench-type device isolation layer is formed.

Figure 12:
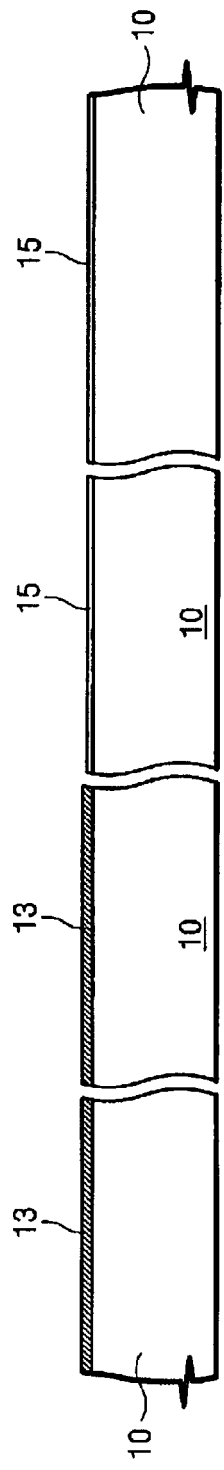

Referring to FIG. 12, a thick gate insulating layer 13 for forming a high-voltage device is formed on a substrate 10. By patterning the gate insulating layer 13, a thick gate insulating layer in a peripheral low-voltage region and a cell array region is removed, and the substrate is exposed. An etch-mask pattern (not shown) used in the patterning is removed, and then is subjected to thermal oxidation to form a thin gate insulating layer 15 on a surface of the exposed substrate 10. In this embodiment or others, the formation order of these gate insulating layers 13 and 15 may be changed.

Figure 13:
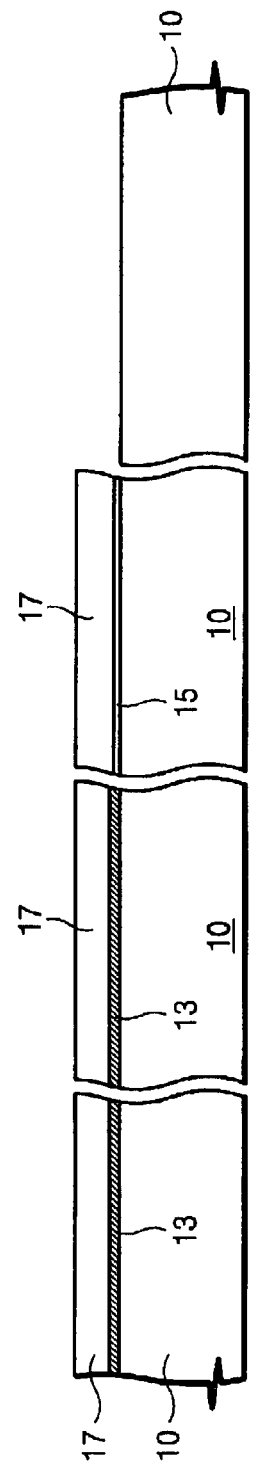

Referring to FIG. 12 and FIG. 13, a first polysilicon layer 17 is formed over substantially the entire surface of a substrate 10 where the thick gate insulating layer 13 and the thin gate insulating layer 15 are formed. A doping concentration of the first polysilicon layer 17 is controlled to accommodate a particular value of a later-formed resister. For patterning, an etch mask pattern (not shown) is formed on the first polysilicon layer 17 to expose the cell array region. An etching process is then performed to remove the first polysilicon layer 17 and the thin gate insulating layer 15.

Referring to FIG. 14, an ONO triple layer 19 is formed on the exposed substrate 10 of the cell array region and on first polysilicon layers 17 of the other regions. A second polysilicon layer 21 is formed on the triple layer 19.

Referring to FIG. 15, a device isolation layer 111 is formed on the substrate where the second polysilicon layer 21 is formed. The device isolation layer 111 is formed using a self-aligned shallow trench isolation (SASTI) technique that is well known to a person skilled in the art. A mask pattern 113 for etching a trench is formed on the substrate where the second polysilicon layer 21 is formed. The mask pattern 113 is made of silicon nitride. The layers 21, 19, 17, 13, and 15 and the substrate 10 are etched to form a trench in the substrate 10. The trench is filled with an insulator such as CVD oxide, and a CMP process is carried out to expose the mask pattern 113. In a subsequent process, the mask pattern 113 is isotropically etched to make the device isolation layer 111 remain. Further, a trench inner wall may be annealed or a silicon nitride liner may be formed during formation of the device isolation layer.

Figure 16:
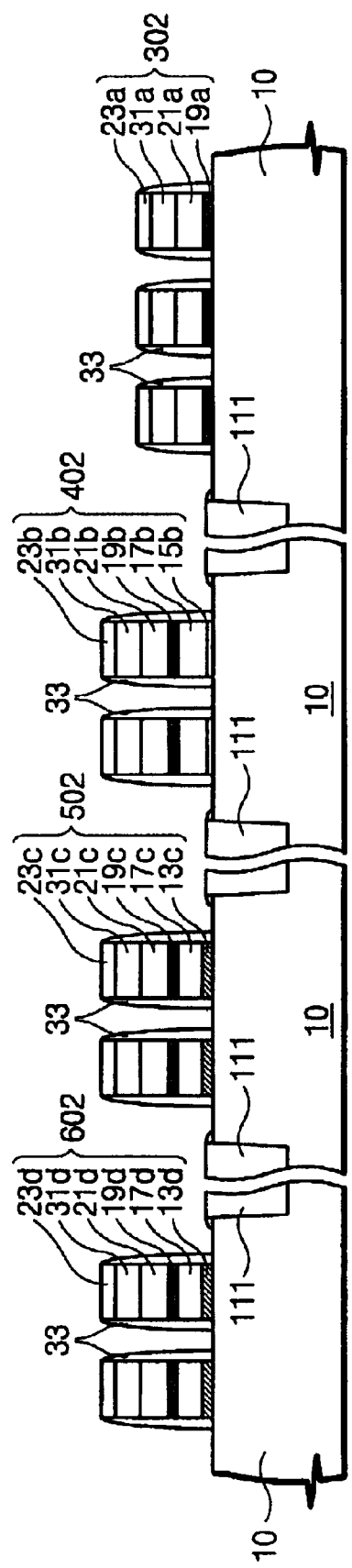

Referring to FIG. 16, a third polysilicon layer and a metal silicide layer are sequentially formed over substantially the entire surface of the substrate. The substrate is patterned to form gate patterns 302, 402, and 502 and a resistor pattern 602 in each region. An insulating spacer 33 is formed on a sidewall of each pattern. An unprotected device isolation layer 111 is etched, so that an elevation of its top surface is lowered to be similar to that of the substrate.

Figure 17:
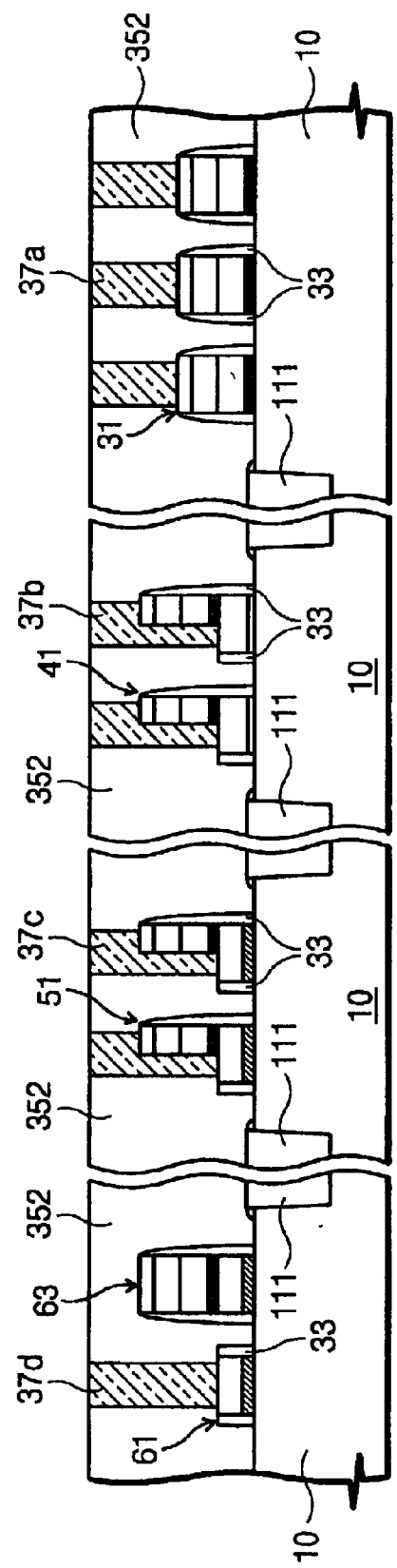

Referring to FIG. 17, process steps identical to those of embodiment 1 in FIG. 7 and FIG. 8 are performed. That is, patterns are partially etched, an interlayer insulating layer 352 is stacked, and contact plugs 37a, 37b, 37c, and 37d are formed. Also, a triple layer and its upper layers are removed in a contact region 61 of a resistor pattern and are partially removed in contact regions 41 and 51 of high-and low-voltage-type gate pattern in the peripheral device region.

Accordingly, as shown in FIG. 17, a contact plug 37d is connected to only a first polysilicon layer used as a resistor layer in the contact region of the resistor pattern. A SONOS-type flash device structure is made, in which butting contacts 37c and 37b are formed on the high-and low-voltage-type gate patterns.

Figure 18:
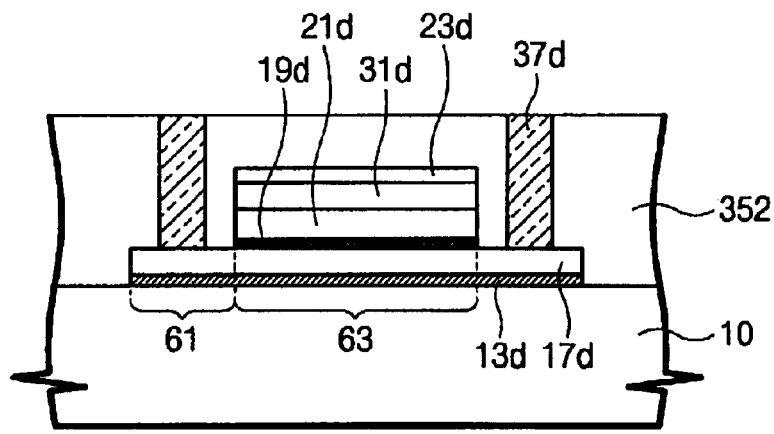
FIG. 18 through FIG. 20 are cross-sectional views each being taken along patterns of FIG. 17.
Figure 19:
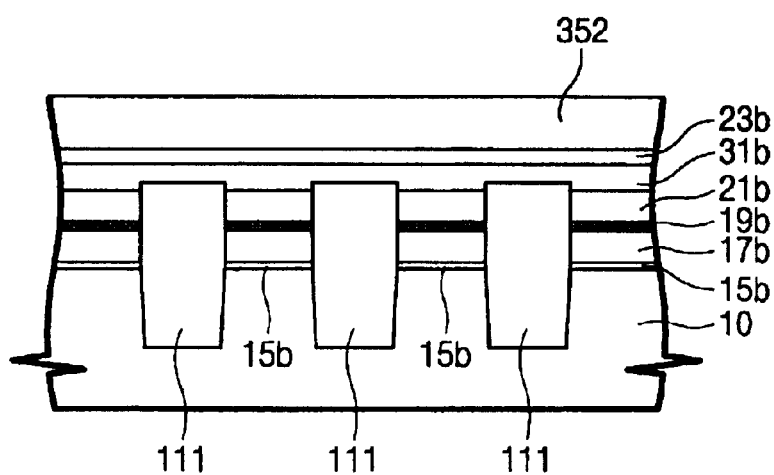
Figure 20:
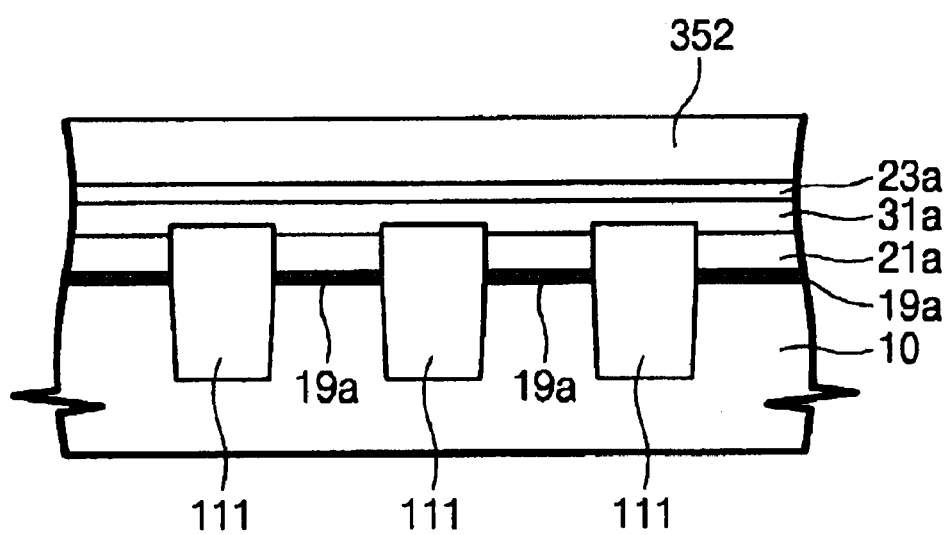

FIG. 18 through FIG. 20 are cross-sectional views taken along the planes of patterns 602, 402, and 302 depicted in FIG. 17.

In FIG. 18, compared with the FIG. 9 of the first embodiment, a third polysilicon layer 31d is formed between a second polysilicon layer 21d and a metal silicide layer 23d. Substantially, because a resistor layer of a resistor pattern is a first polysilicon layer 17d, a resistor difference does not exist between the first and second embodiments.

Referring to FIG. 19 and FIG. 20, compared with FIG. 10 and FIG. 11 of the first embodiment, top surfaces of second polysilicon layers 21a and 21b formed prior to formation of a device isolation layer 111 are lower than the device isolation layer in elevation. Lower conductive layers of a second conductive layer are made of polysilicon. Therefore, assuming that second and third polysilicon layers 21a and 31a are regarded as one polysilicon layer, a cell array region shown in FIG. 20 has the same structure as that of the first embodiment (see FIG. 11).

Embodiment 3

In this embodiment, compared with the first and second embodiments, no triple layer acting as an insulating layer exists between conductive layers in structures of high-and low-voltage-type gate patterns in the peripheral device region. Thus, a contact coupled to a gate pattern of a later-formed peripheral device need not be a butting contact.

The same steps as FIG. 2 through FIG. 4 of the first embodiment are carried out. Then, referring to FIG. 21, an ONO triple layer 19 is formed on an exposed substrate 10 of a cell array region and on the first polysilicon layers of the other regions. A second polysilicon layer 21 is formed on the ONO triple layer 19. An etch mask pattern 115 is then formed to separate a resist region from the cell array region.

Referring to FIG. 22, the second polysilicon layer 21 and the third triple layer 19 are removed by etching. The etch mask pattern 115 then is removed. A metal silicide layer 23 is stacked over substantially the entire surface of the substrate 10. Accordingly, a metal silicide layer is disposed on a first polysilicon layer in later-formed peripheral high-and low-voltage-type devices.

Figure 23:
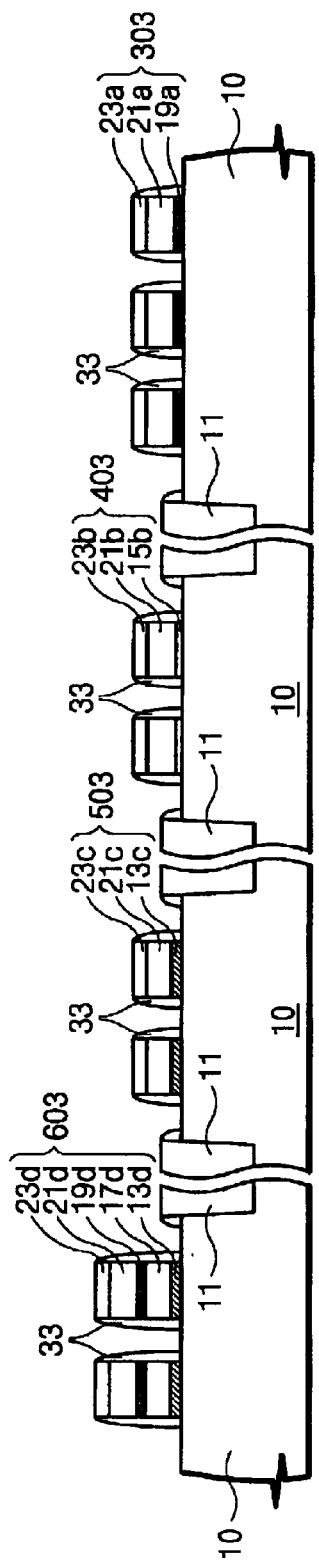

Referring to FIG. 23, substantially the entire surface of the substrate 10 is patterned to form gate patterns 303, 403, and 503 and a resistor pattern 603 in the respective regions. In an unpatterned region, the substrate 10 is exposed. An insulating spacer 33 is formed on the sidewalls of the gate patterns 303, 403, and 503 and on the sidewalls of the resistor pattern 603.

Figure 24:
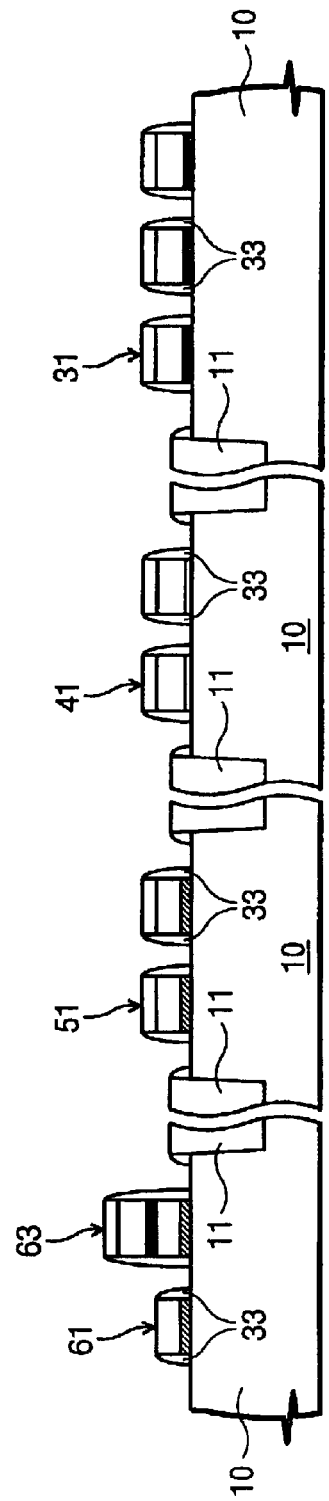

Referring to FIG. 23 and FIG. 24, a photoresistor pattern (not shown) is formed for exposing a contact region 61 of a resistor pattern. An etching process is then performed to sequentially remove a metal silicide layer 23d, a second polysilicon layer 21d, and a triple layer 19d. An insulating spacer 33, formed on a sidewall of a resistor pattern of the contact region 61, is also etched to lower a top surface thereof. Although not shown in the drawings, all regions of a resistor pattern including a line region 63 may be etched.

Figure 25:
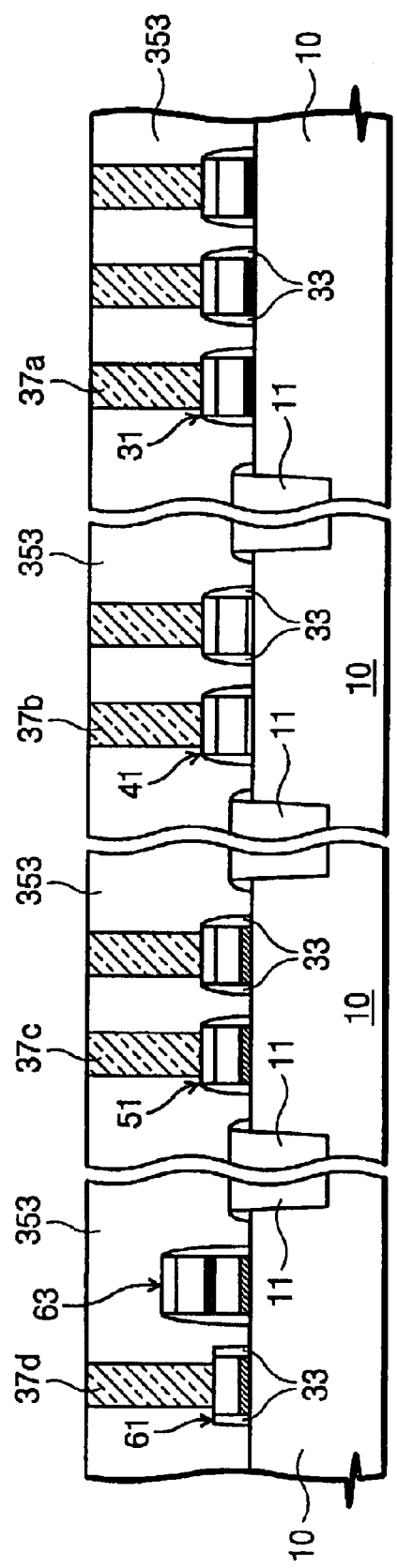

Referring to FIG. 23 and FIG. 25, an interlayer insulating layer 353 is formed over the gate pattern and the resistor pattern. Conventionally, a step of planarizing the interlayer insulating layer 353 is also performed. The inter layer insulating layer 353 is patterned to expose metal silicide layers 23a, 23b, 23c, and 23d in a part of each gate pattern. A contact hole is formed in a contact region of a resistor pattern to expose a first polysilicon layer. A conductive layer made of tungsten or the like is stacked to fill the contact hole. A CMP process is carried out to expose the interlayer insulating layer 353. Contact plugs 37a, 37b, 37c, and 37d are formed in the contact hole.

In a subsequent process, by stacking and patterning a conductive layer on an interlayer insulating layer where a contact plug is formed, an upper interconnection may be formed.

Embodiment 4

This embodiment is similar to the embodiment 3, but the steps of forming a resistor pattern on a device isolation layer are described.

Figure 26:
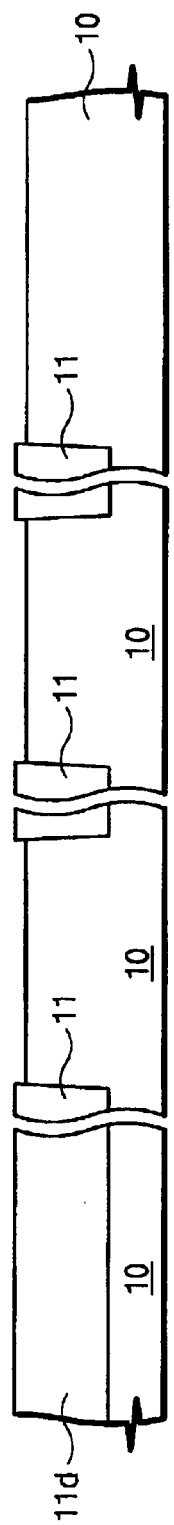
FIG. 26 through FIG. 32 are processing cross-sectional views of a fourth embodiment of the present invention.

Referring to FIG. 26, a device isolation layer 11 is formed at a substrate 10. Although the device isolation layer 11 is a trench-type device isolation layer in this embodiment, it may be a LOCOS-type device isolation layer. In this case, a trench-type device isolation layer 11d is formed substantially throughout a resist region.

Figure 27:
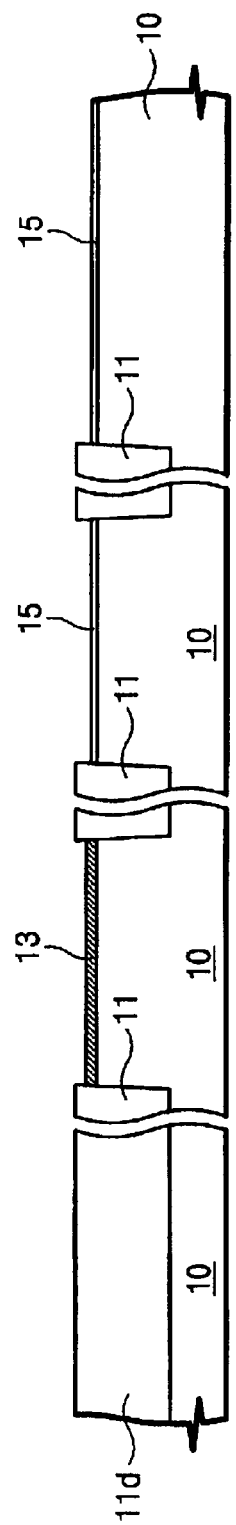

Referring to FIG. 27, gate insulating layers 13 and 15 each having a defined thickness are formed in each region of the substrate 10 where the device isolation layer 11 is formed. That is, the thick gate insulating layer 13 is formed in a peripheral high-voltage region and a thin gate insulating layer 15 is formed in a peripheral low-voltage region. A gate insulating layer is not formed in a resist region where the device isolation layer 11d is formed.

Figure 28:
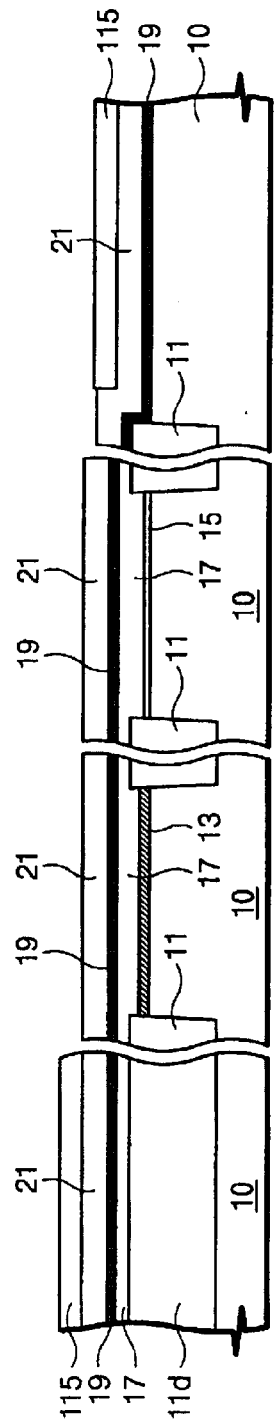

Referring to FIG. 28, a first polysilicon layer 17 is formed on a substrate 10 where the gate insulating layer 13 and 15 are formed. A patterning process is then performed to remove the first polysilicon layer 17 and the gate insulating layer 15 in a cell array region. the etch mask used in the patterning process is removed. An ONO triple layer 19 and a second polysilicon layer 21 are formed over substantially the entire surface of the substrate 10. A photoresistor pattern 115 is formed to cover the second polysilicon layer in the cell array region.

Figure 29:
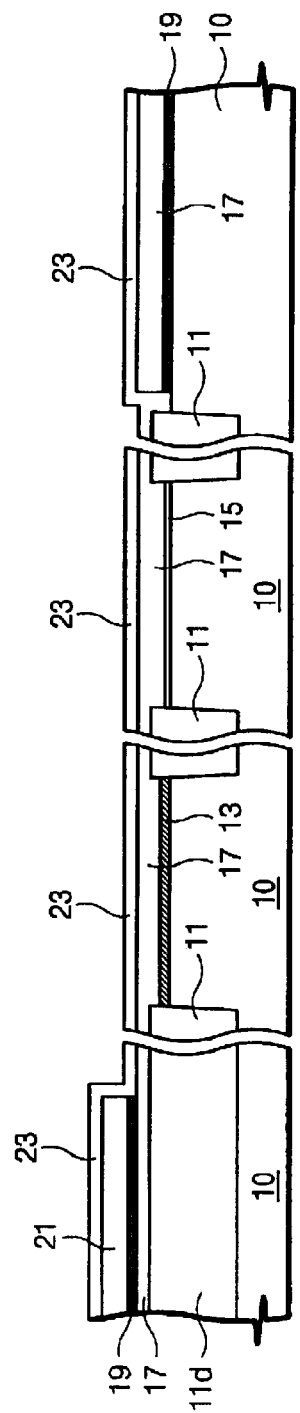

Referring to FIG. 28 and FIG. 29, the second polysilicon layer 21 is etched. A photoresistor pattern used as the etch mask is removed. A metal silicide layer 23 is stacked over substantially the entire surface of the substrate. Accordingly, in later-formed peripheral high-and low-voltage-type gate patterns, a metal silicide layer is disposed on a first polysilicon layer.

Figure 30:
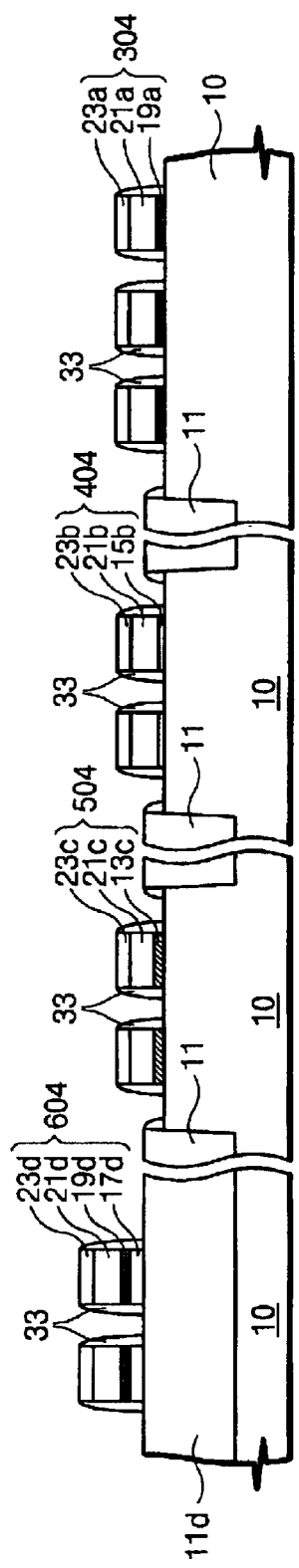
Figure 31:
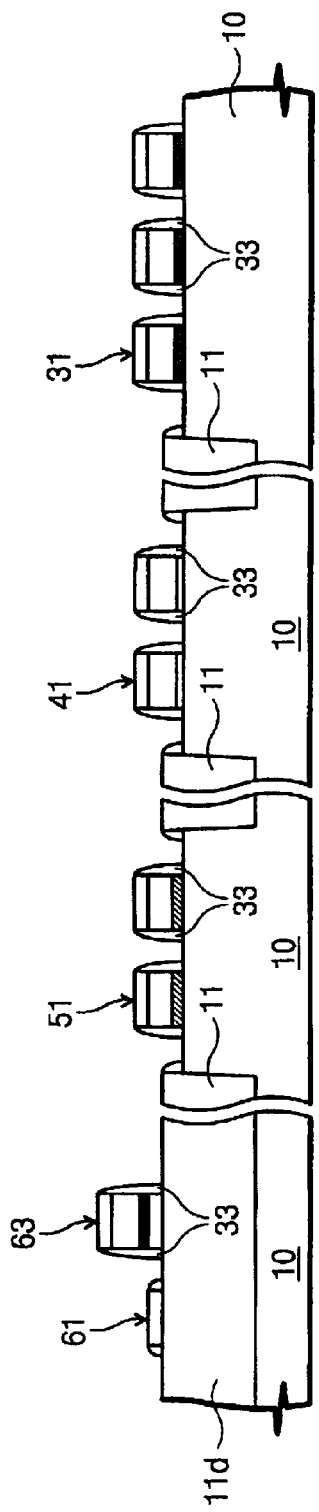
Figure 32:
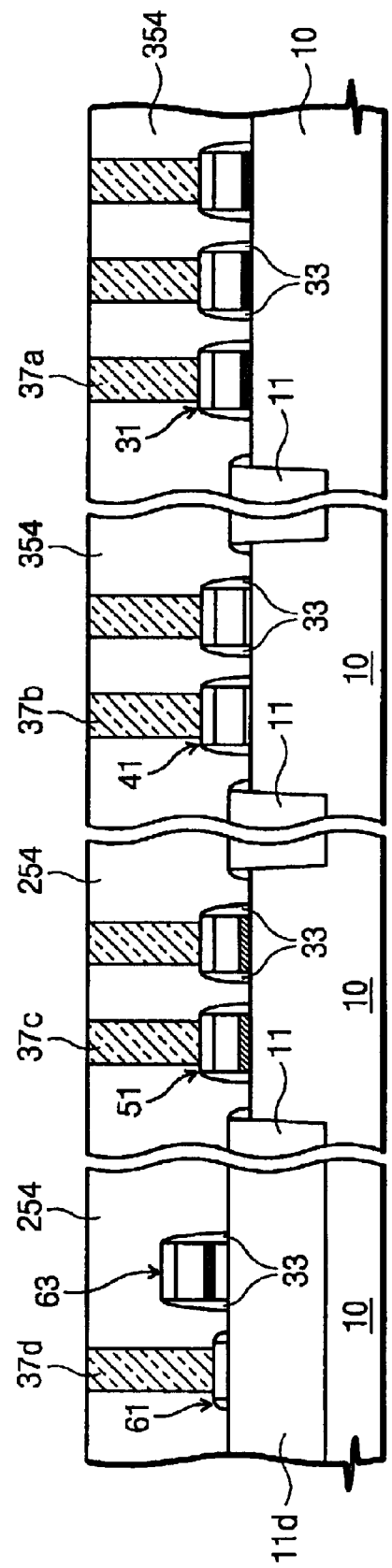

Referring to FIG. 30 through FIG. 32, the same process steps as FIG. 23 through FIG. 25 of embodiment 3 are performed. However, overetch must be prevented in the step of forming a resistor pattern 604 because the device isolation layer 11d, not a thick gate insulating layer, is formed under the first polysilicon layer 17d.

Embodiment 5

Although this embodiment is similar to embodiment 3, differences therebetween are that a triple layer and a second polysilicon layer are stacked and are removed in a resist region, and a metal silicide layer must be removed in all regions of a resistor pattern because the triple layer does not exist in the resistor pattern.

Figure 33:
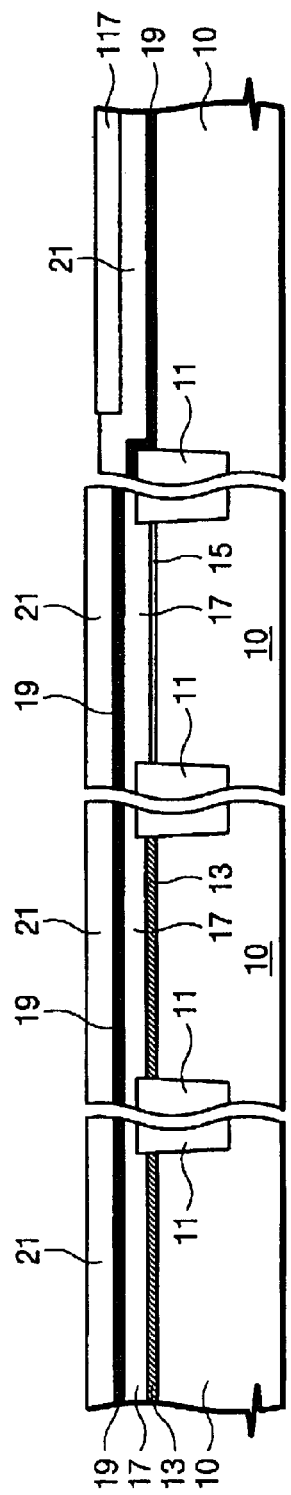
FIG. 33 through FIG. 37 are processing cross-sectional views of a fifth embodiment of the present invention.

The same process steps as described in FIG. 2 through FIG. 4 of embodiment 1 are carried out. Then, referring to FIG. 33, an ONO triple layer 19 is formed on a substrate 10 of a cell array region and on first polysilicon layers 17 of the other regions by thermal oxidation and CVD manners. A second polysilicon layer 21 is formed on the ONO triple layer 19. An etch mask pattern 117 is formed over the substrate to cover the cell array region.

Figure 34:
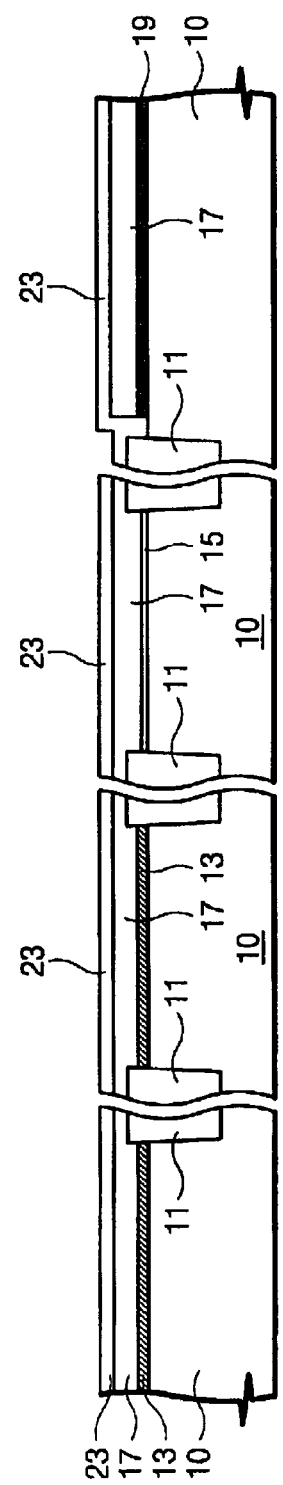

Referring to FIG. 34, the second polysilicon layer 21 and the triple layer 19 are removed by etching. The etch mask pattern 117 is removed. A metal silicide layer 28 is stacked over substantially the entire surface of the substrate, so that the metal silicide layer 23 is disposed on the first polysilicon layer 17 in the resist region and peripheral high-and low-voltage regions.

Figure 35:
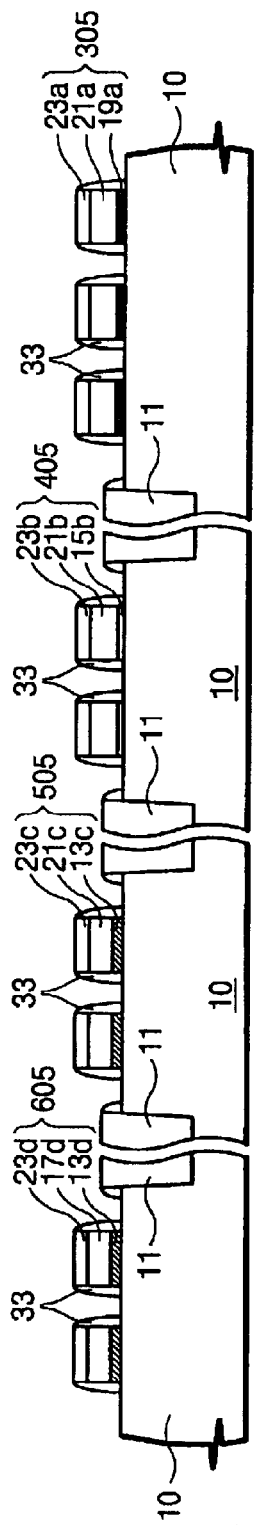

Referring to FIG. 35, the entire surface of the substrate is patterned to form gate patterns 305, 405, and 505 and a resistor pattern 605 in respective regions. An insulating spacer 33 is formed on sidewalls of the gate patterns 305, 405, and 505 and on a sidewall of the resistor pattern 605.

Figure 36:
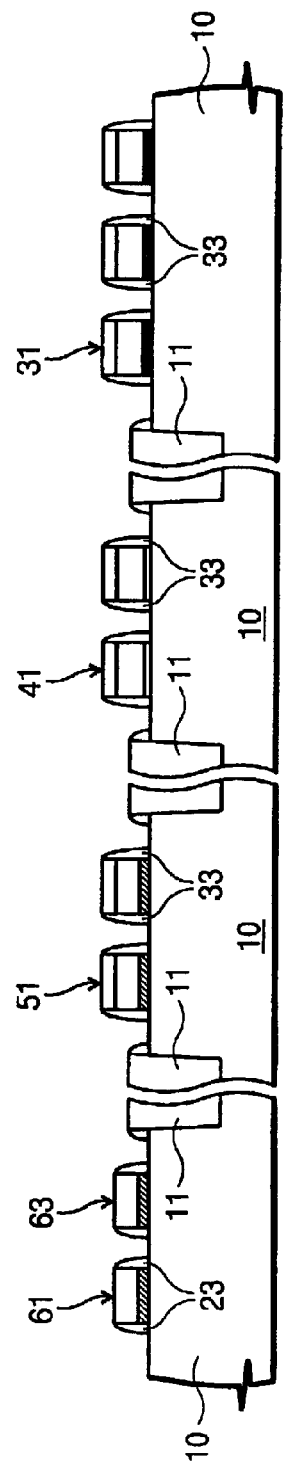

Referring to FIG. 35 and FIG. 36, a photoresistor pattern (not shown) is formed for exposing an overall region where the resistor pattern 605 is formed. An exposed metal silicide layer 23d is etched to expose a first polysilicon layer 17d in a contact region 61 and a line region 63 of the resistor pattern. A photoresistor pattern (not shown) is removed.

Figure 37:
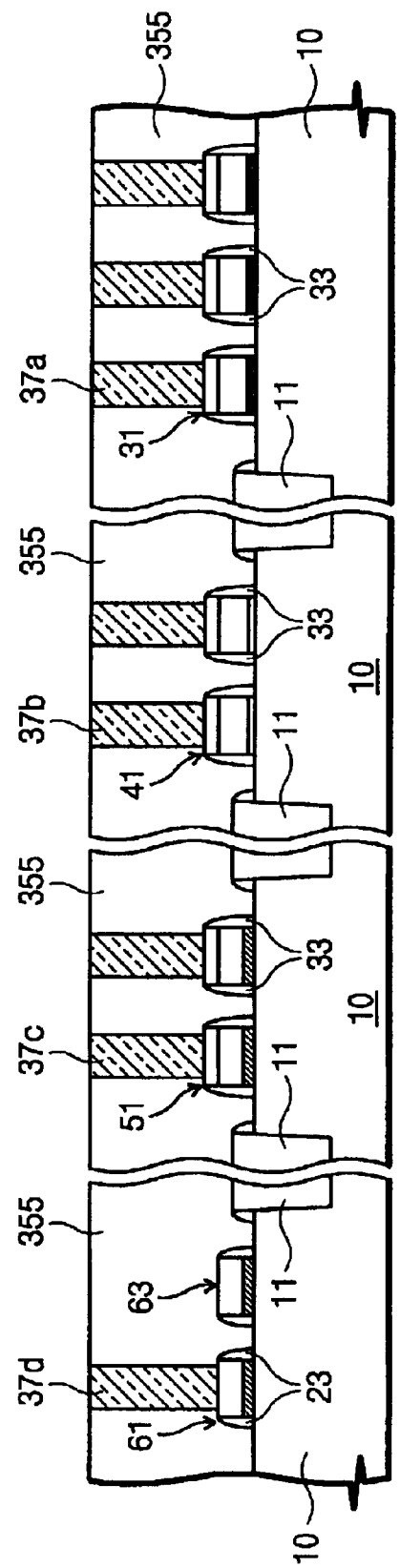

Referring to FIG. 37, an interlayer insulating layer 355 is stacked over substantially the entire surface of the substrate. The interlayer insulating layer 355 is patterned to form a contact hole exposing a contact region that is a part of each gate pattern or the resistor pattern. A conductive layer is stacked to fill the contact hole. A CMP process is performed to expose a top surface of the interlayer insulating layer 355. That is, only contact plugs 37a, 37b, 37c, and 37d made of conductor remain. Alternatively, without the CMP process, the conductive layer is patterned to form an upper interconnection coupled to a contact plug.

Embodiment 6

Although this embodiment is similar to embodiment 4, differences therebetween are that a triple layer and a second polysilicon layer is stacked and removed in a resist region, and a metal silicide layer must be removed in all regions of a resistor pattern because the triple layer does not exist in the resistor pattern.

Figure 38:
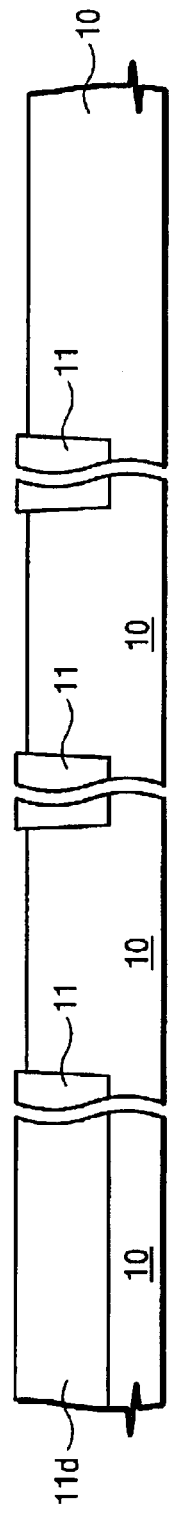

Referring to FIG. 38, a device isolation layer 38 is formed at a substrate 10. Although the device isolation layer 38 is a trench-type device isolation layer, it may be a LOCOS-type device isolation layer. In this case, a trench-type device isolation layer 11d is formed throughout the resist region.

Figure 39:
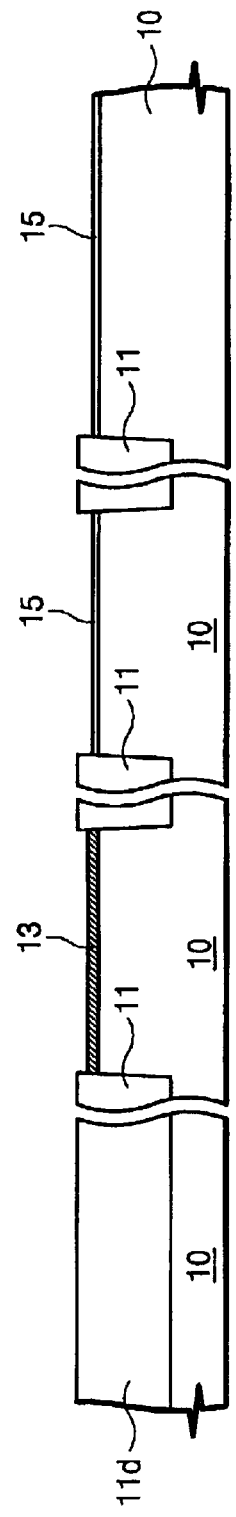

Referring to FIG. 39, gate insulating layers 13 and 15 each having a necessary thickness are formed in each region of a substrate where the device isolation layer 11 is formed. That is, a thick gate insulating layer 13 is formed in a peripheral high-voltage-type device region and a thin gate insulating layer 15 is formed in a peripheral low-voltage-type device region. The gate insulating layer is not formed in the resist region where a device isolation layer 11d is formed.

Referring to FIG. 39 and FIG. 40, a first polysilicon layer 17 is formed on the substrate 10 where the device isolation layer 11 and the gate insulating layers 13 and 15 are formed. A patterning process is performed to remove a first polysilicon layer 17 and a gate insulating layer 15 in a cell array region. The etch mask used in the patterning process is then removed.

Referring to FIG. 41, an ONO triple layer 19 and a second polysilicon layer 21 are stacked on a substrate 10 of FIG. 40. An etch mask pattern (not shown) is formed to cover the cell array region. An etch process is then performed to remove the second polysilicon layer 21 and the triple layer 19 on a substrate in locations other than the cell array region. The etch mask pattern is removed. A metal suicide layer 23 is stacked over substantially the entire surface of the substrate, so that the metal silicide layer 23 is disposed on the first polysilicon layer 17 in the peripheral high-and low-voltage-type device region.

Figure 42:
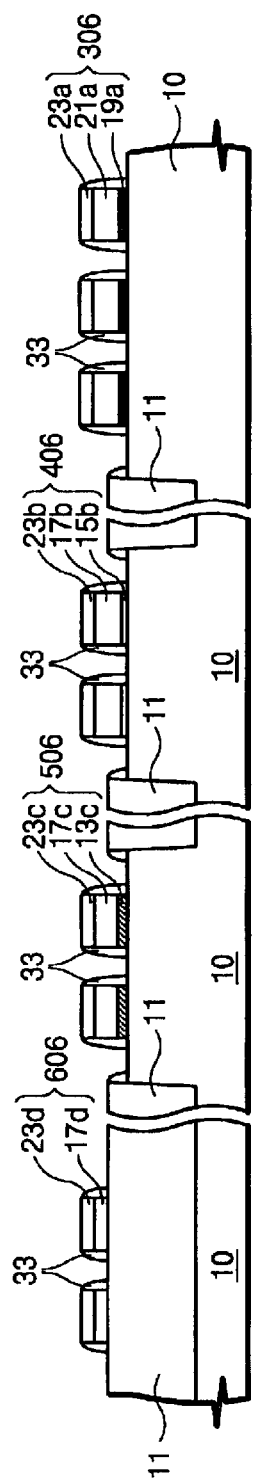
Figure 43:
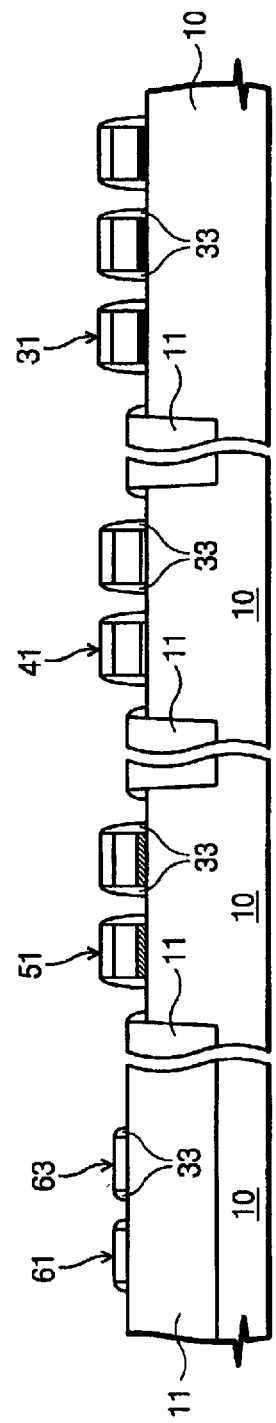
Figure 44:
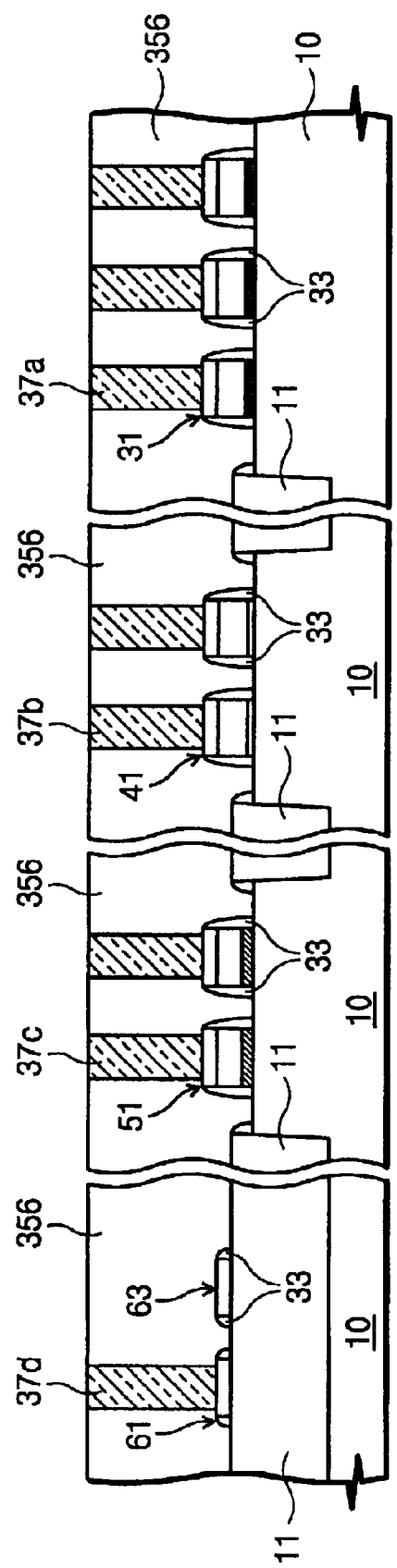

Referring to FIG. 42 through FIG. 44, it will be understood that process steps similar to the process steps of FIG. 35 through FIG. 37 of embodiment 5 are performed for the substrate 10 of FIG. 41. However, because a gate insulating layer does not exist when a resistor pattern 606 is formed in the resist region, it is not patterned. Preferably, overetching of device isolation layer 11d is suppressed during formation of the resistor pattern.

Figure 45:
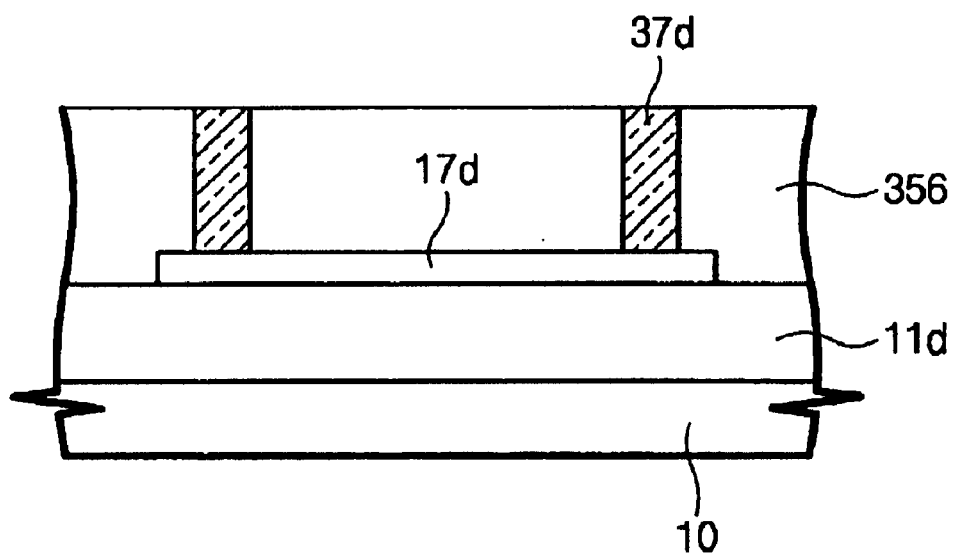
FIG. 45 is a cross-sectional view taken along a resistor pattern shown in FIG. 44.

FIG. 45 is a cross-sectional view taken along the plane of the resistor pattern 606 of FIG. 44. In the resistor pattern 606, only a first polysilicon layer 17d is formed in both contact and line regions 61 and 63 where a contact plug 37d is formed.

Embodiment 7

This embodiment describes an example of fabricating a non-volatile semiconductor device without a triple layer and a butting contact in gate patterns of peripheral high-and low-voltage devices in a self-aligned manner.

Figure 46:
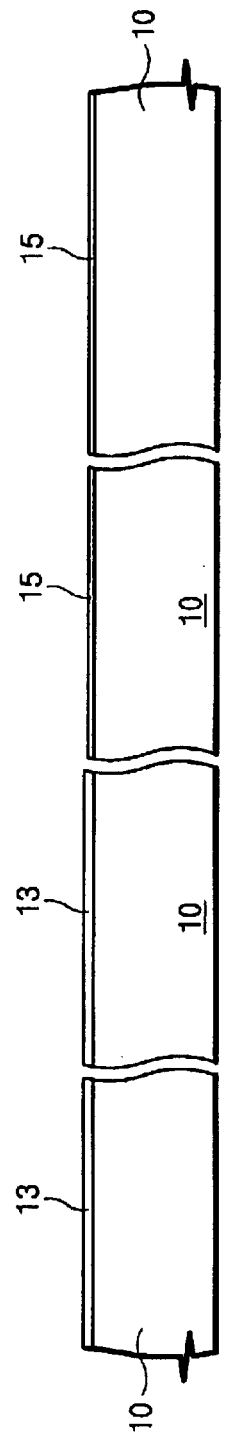
FIG. 46 through FIG. 53 are processing cross-sectional views of a seventh embodiment of the present invention.

Referring to FIG. 46, a thick gate insulating layer 13 for forming a high-voltage type transistor and a thin gate insulating layer 15 for forming a low-voltage type transistor are formed on a substrate 10.

Figure 47:
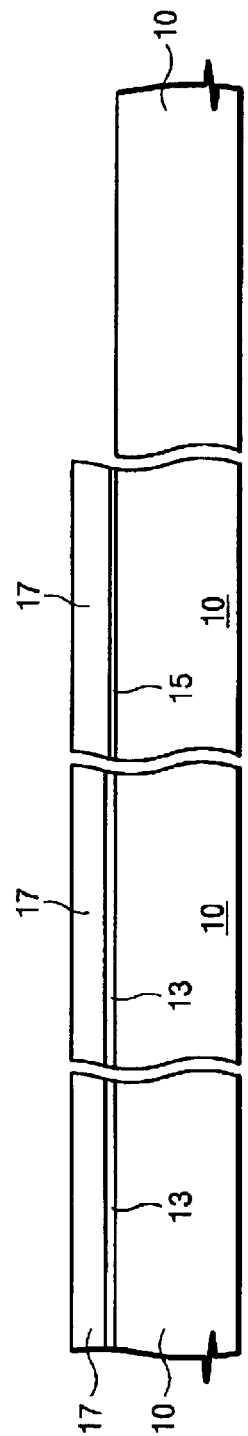

Referring to FIG. 46 and FIG. 47, a first polysilicon layer 17 is formed over substantially the entire surface of the substrate 10 where the thick gate insulating layer 13 and the thin gate insulating layer 15 are formed. For a patterning process, an etch mask pattern (not shown) is formed on the first polysilicon layer 17 to expose a cell array region. An etch process is then performed to remove the first polysilicon layer 17 and the thin gate insulating layer 15.

Figure 48:
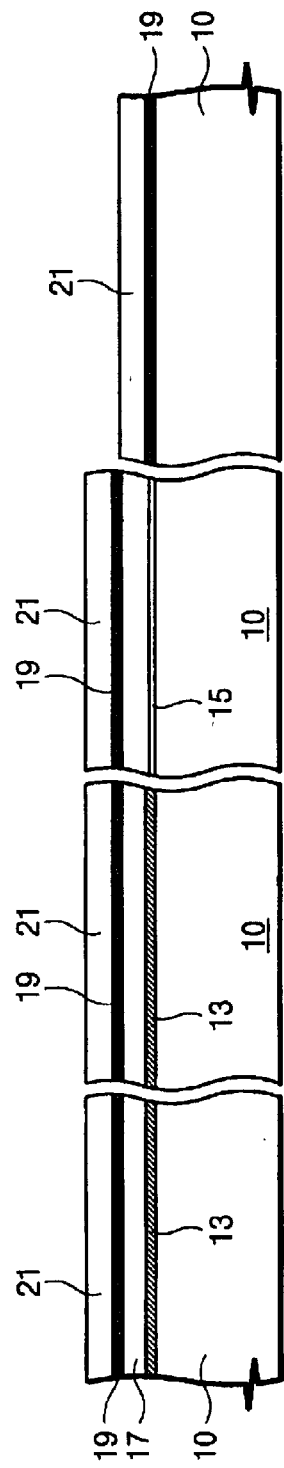

Referring to FIG. 48, an ONO triple layer 19 is formed on a substrate of the cell array region and on the first polysilicon layer 17 of the other regions. A second polysilicon layer 21 is formed on the ONO triple layer 19.

Figure 49:
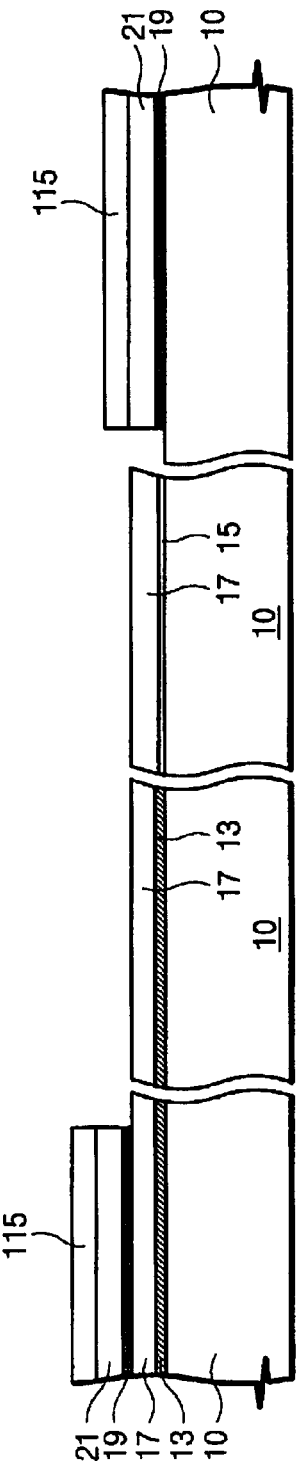

Referring to FIG. 49, an etch mask pattern 115 for covering the cell array region and the resist region is formed on a substrate 10 where the second polysilicon layer 21 is formed. An etch process is performed to remove the second polysilicon layer 21 and the triple layer 19 in the peripheral high-and low-voltage-type device region.

Figure 50:
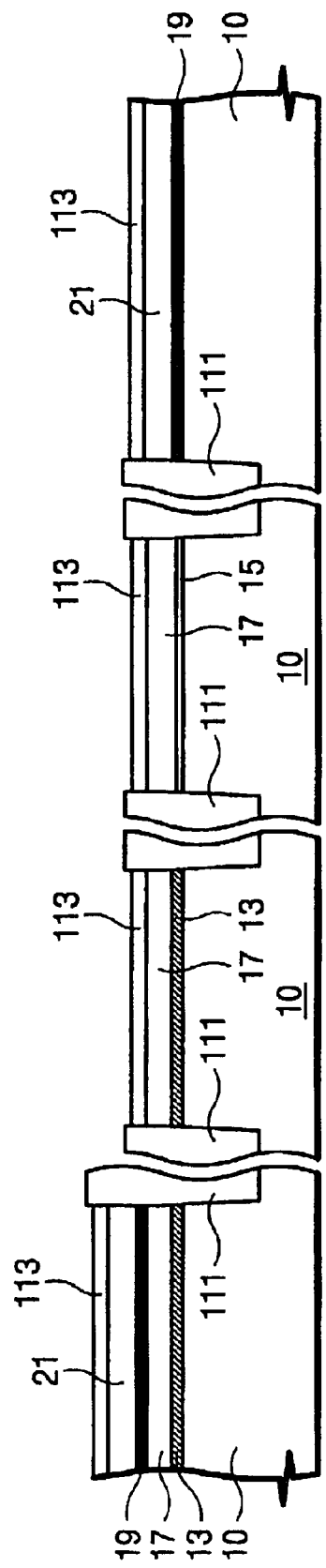

Referring to FIG. 50, the etch mask pattern 115 is removed. A trench etch mask 113 is formed, and a trench type device isolation layer 111 is formed. An isotropical etch technique is then used to remove the trench etch mask 113.

Figure 51:
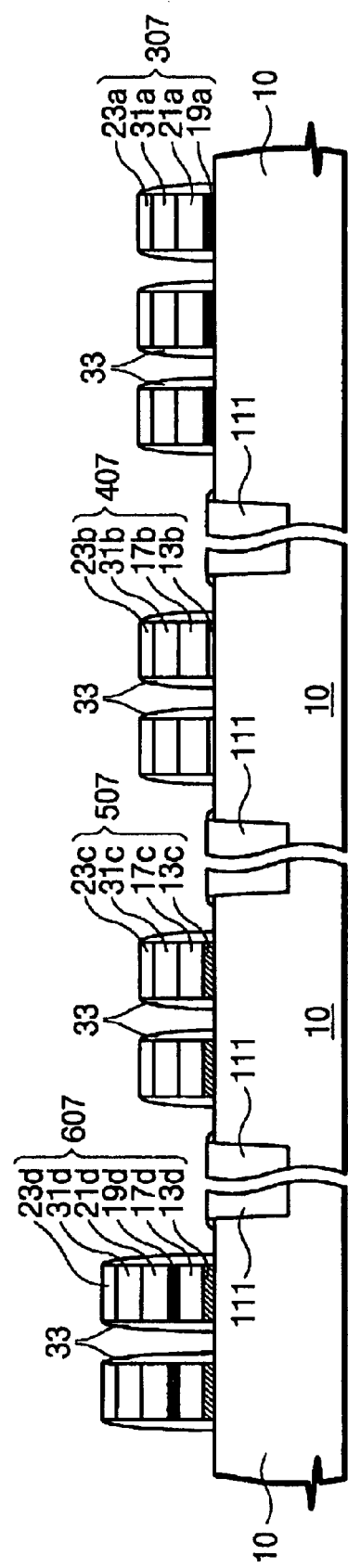

Referring to FIG. 51, a third polysilicon layer and a metal silicide layer are formed over the trench-type device isolation layer 111. The substrate 10 is patterned to form gate patterns 307, 407, and 507 and a resistor pattern 607 in respective regions. Insulating spacers 33 are formed on sidewalls of all the patterns 307, 407, 507, and 607.

Figure 52:
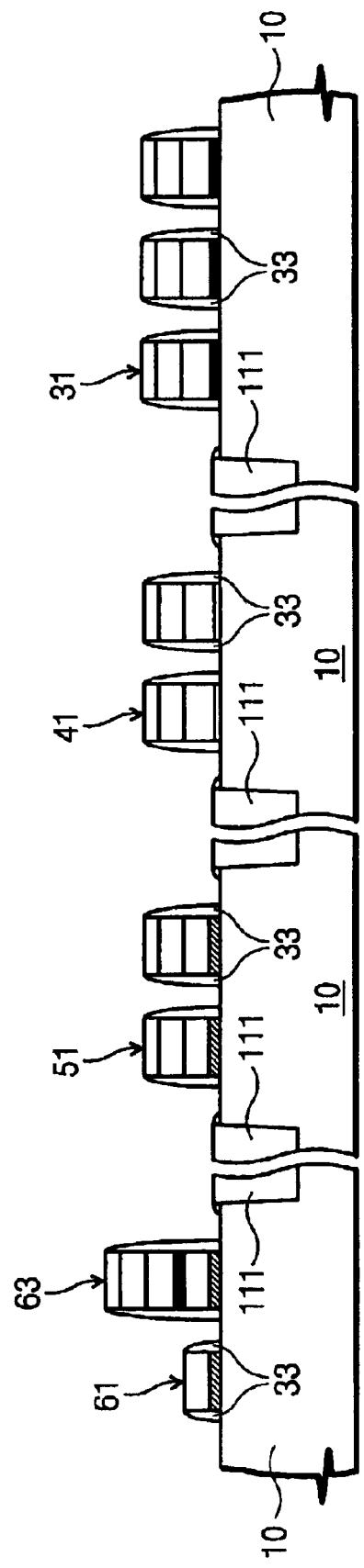

Referring to FIG. 51 and FIG. 52, an etch mask pattern (not shown) exposing the contact region of the resistor pattern 607 is formed over a substrate 10 where the gate patterns 307, 407, and 507 and the resistor pattern 607 are formed. A metal silicide layer 23d, a third polysilicon layer 21d, a third polysilicon layer 31d, a second polysilicon layer 21d, and a triple layer 19d are sequentially etched to expose the first polysilicon layer 17d.

Figure 53:
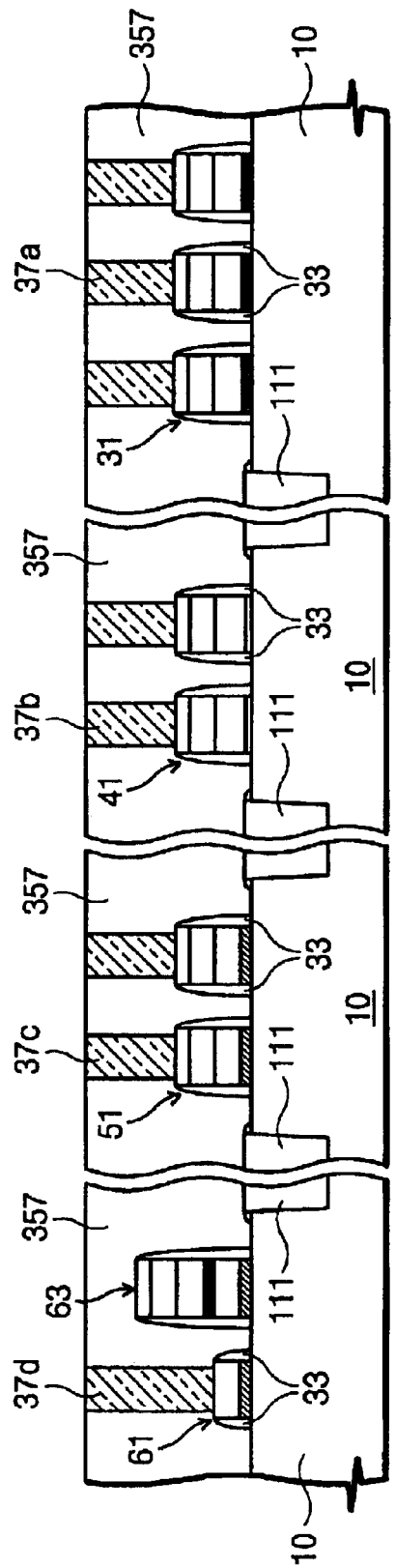

Referring to FIG. 53, an interlayer insulating layer 357 is formed over substantially the entire surface of the substrate 10 of FIG. 52. The interlayer insulating layer 357 is patterned to form a contact hole exposing a part of the gate patterns 307, 407, and 507 and the contact region 61 of the resistor pattern 607. A conductive layer is stacked to fill a contact hole. A CMP technique is used to remove the conductive layer except the contact plugs 37a, 37b, 37c, and 37d.

In a subsequent process, an upper interconnection may be formed over an interlayer insulating layer where the contact plug is formed.

Embodiment 8

Although this embodiment is similar to embodiment 7, differences therebetween are that an etch mask pattern covers only a cell array region during the step of removing a second polysilicon layer and a triple layer, so that the triple layer does not exist between resistor pattern layers of a resist region.

The same process steps as described in FIG. 46 through FIG. 48 of embodiment 7 are performed.

Figure 54:
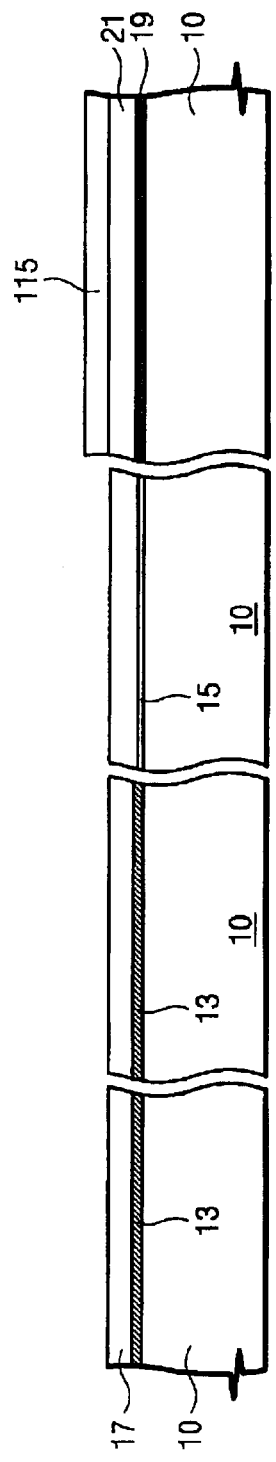
FIG. 54 through FIG. 58 are processing cross-sectional views of an eighth embodiment of the present invention.

Referring to FIG. 54, an etch mask pattern 115 is formed to cover the cell array region of FIG. 48. A second polysilicon layer 21 and a triple layer 19 are etched. In all regions except for the cell array region, a first polysilicon layer 17 is stacked on gate insulating layers 13 and 15.

Figure 55:
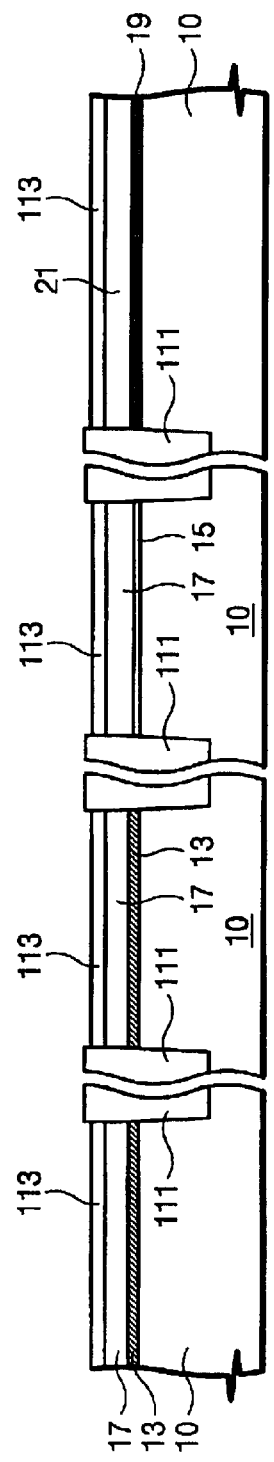

Referring to FIG. 54 and FIG. 55, following removal of an etch mask pattern 115, a trench etch mask pattern 115 is formed over a substrate 10. A trench-type device isolation layer 111 is formed.

Figure 56:
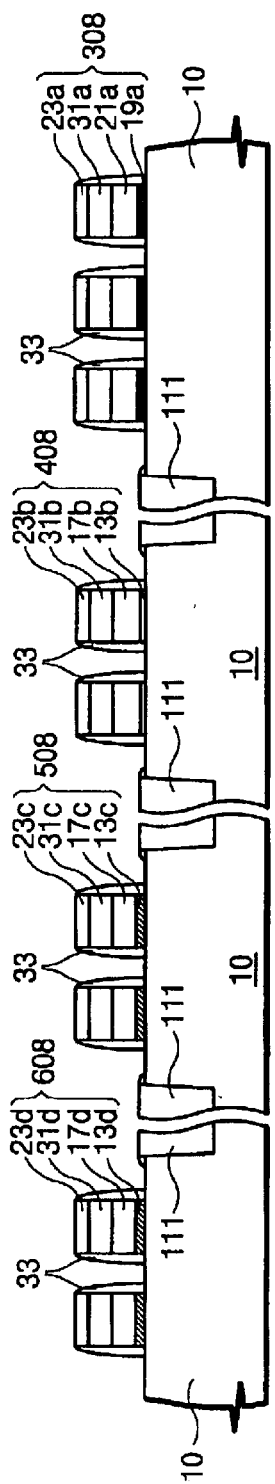

Referring to FIG. 56, a wet etch technique is used to remove the etch mask pattern 115. A third polysilicon layer and a metal silicide layer are further stacked on the trench-type device isolation layer 111. A patterning process is performed to form gate patterns 308, 408, and 508 and a resistor pattern 608 in peripheral high-and low-voltage-type device region and a resist region.

Figure 57:
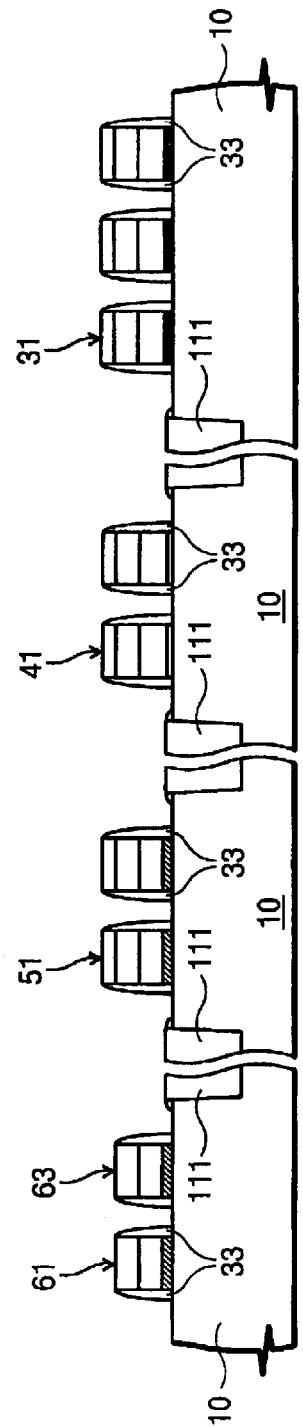

Referring to FIG. 56 and FIG. 57, an insulating spacer 33 is formed on each pattern sidewall. An etch mask (not shown) is formed over the substrate where a pattern is formed, exposing contact 61 and line regions 63 of the resistor pattern 608 and removing the metal silicide layer 23d that is the uppermost layer of the resistor pattern 308. In the resistor pattern 608, a third polysilicon layer 31d and a first polysilicon layer 17d remain as a resist layer that is isolated from the substrate 10 by a thick gate insulating layer 13d.

Figure 58:
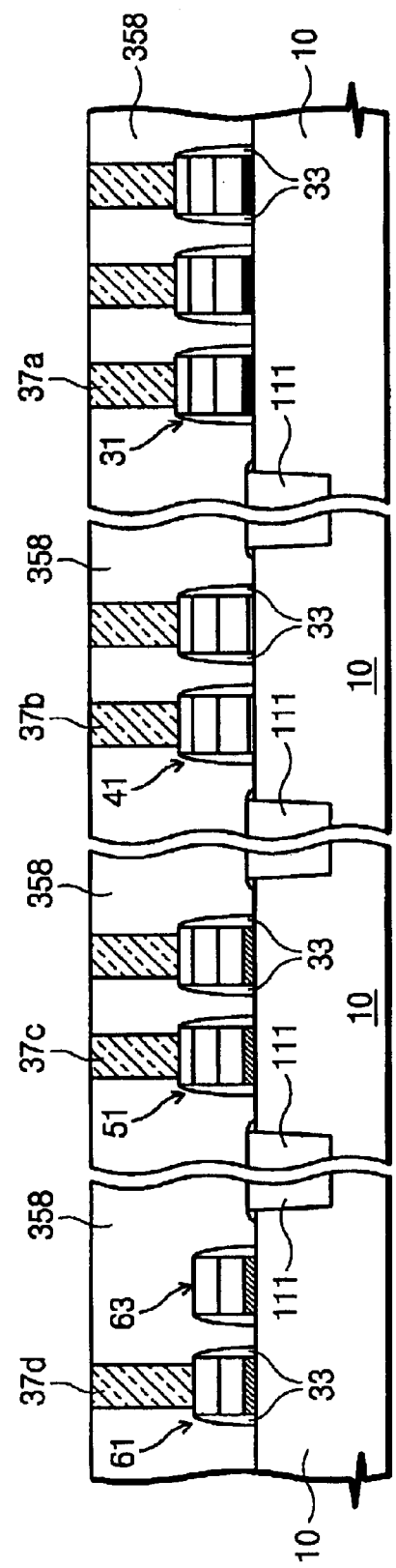

Referring to FIG. 58, an interlayer insulating layer 358 is formed over substantially the entire surface of the substrate 10 of FIG. 57. The interlayer insulating layer 358 is patterned to form a contact hole exposing gate pattern parts 31, 41, and 51 and a contact region 61 of a resistor pattern. A conductive layer is stacked, and a CMP technique is used to form contact plugs 37a, 37b, 37c, and 37d.

Embodiment 9

Although this embodiment is similar to embodiment 8, differences therebetween are that in a step of forming a trench type device isolation layer, one device isolation layer is formed, and then a resistor pattern is formed of only a third polysilicon layer.

The same process steps as described in FIG. 46 through FIG. 48 of embodiment 7 are performed. Thereafter, the same process step as described in FIG. 54 of embodiment 8 is performed.

Figure 59:
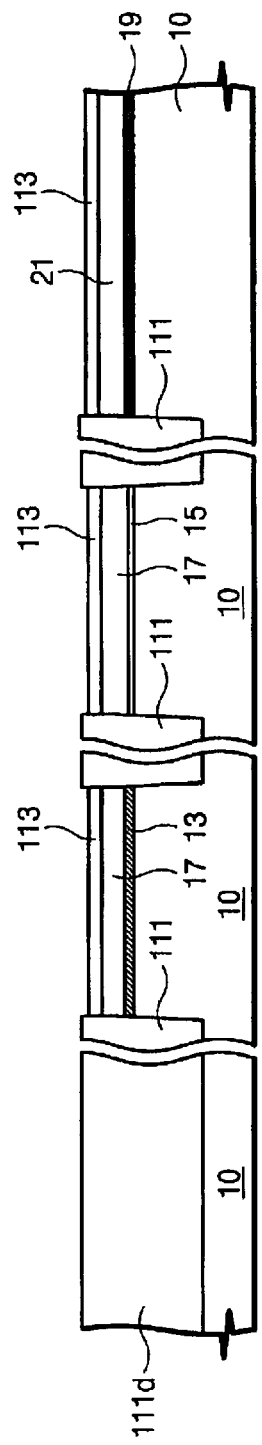
FIG. 59 through FIG. 62 are processing cross-sectional views of a ninth embodiment of the present invention.

Referring to FIG. 59, a trench etch mask 113 is formed over a substrate 10. After a series of etch processes, an insulating layer is stacked by a CVD technique and is planarized by a CMP technique to form a trench-type device isolation layer 111. In a resist region, a wide trench-type device isolation layer 111d is formed to remove layers 13 and 15.

Figure 60:
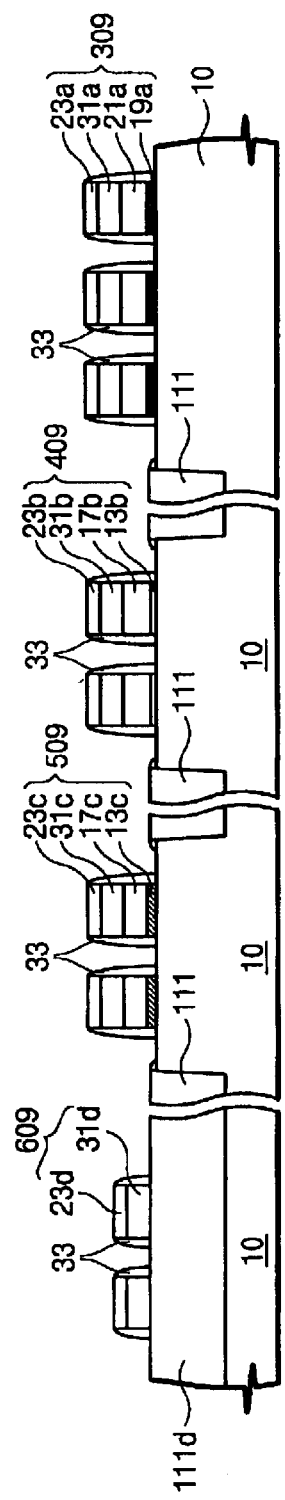

Referring to FIG. 60, a third polysilicon layer and a metal silicide layer are formed over substantially the entire surface of the substrate where the trench type device isolation layer 111 is formed. By a patterning process, gate patterns 309, 409, and 509 and a resistor pattern 609 are formed. The resistor pattern 609 is formed on a device isolation layer 111d, and is composed of a third polysilicon layer 31d and a metal silicide layer 23d. An insulating layer pattern 33 is formed on a pattern sidewall.

Figure 61:
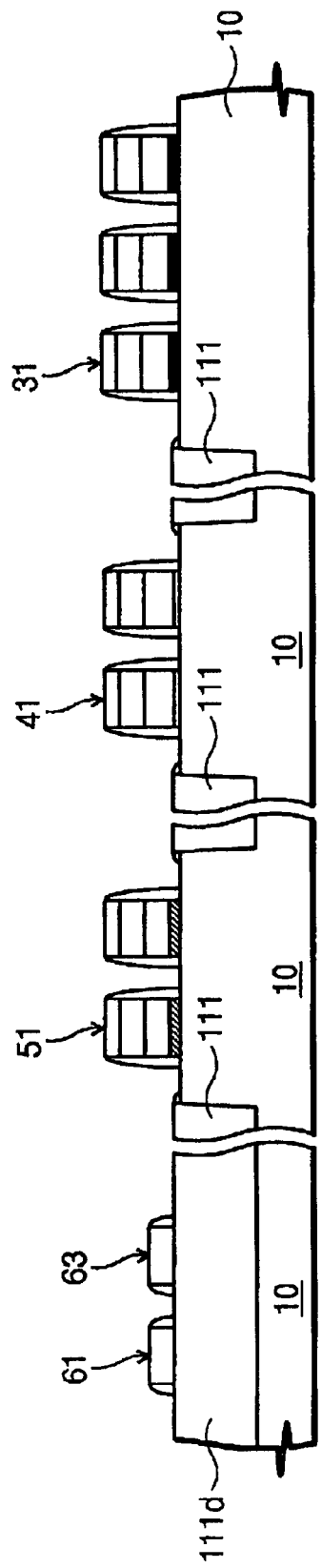

Referring to FIG. 60 and FIG. 61, an etch mask pattern (not shown) is formed to expose contact and line regions 61 and 63 of the resistor pattern 609. An etch process is performed to remove the metal silicide layer 23d of the resistor pattern 609.

Figure 62:
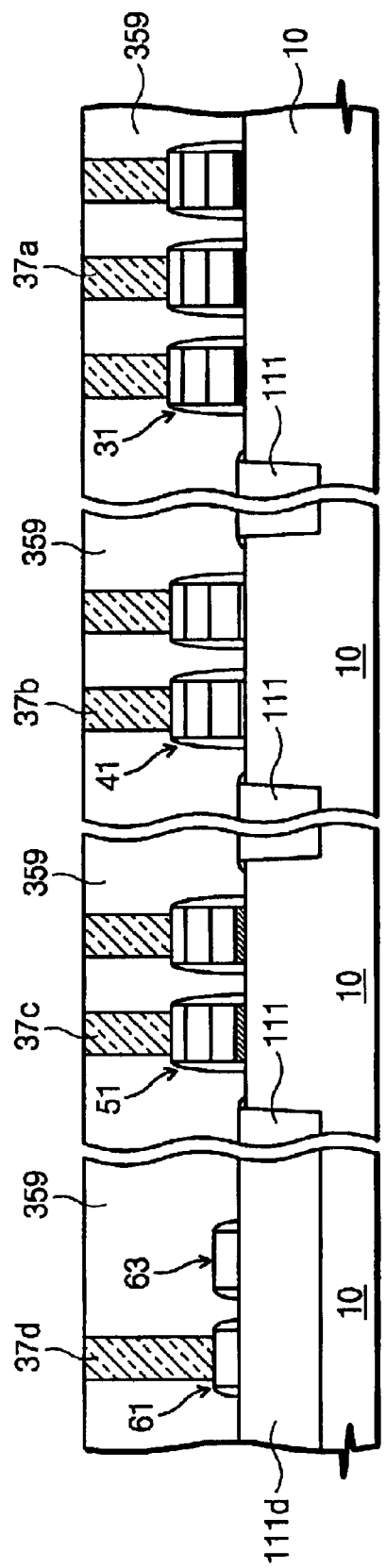

Referring to FIG. 62, an interlayer insulating layer 359 is formed on an entire surface of a substrate 10 under the state of FIG. 61. The interlayer insulating layer 359 is patterned to form a contact hole exposing gate pattern parts 31, 41, and 51 and the contact region 61 of a resistor pattern. A conductive layer is stacked, and then planarized by a CMP technique, to form contact plugs 37a, 37b, 37c, and 37d.

According to the present invention, after forming an ONO triple layer in a cell array region, a second polysilicon layer is directly stacked to minimize damage in a subsequent process. Therefore, layers constituting the triple layer are used as a tunneling insulating layer, a charge storage layer, and a blocking insulating layer with a high reliability. Further, in a resist region, a polysilicon layer of the ONO layer is used as a resist layer to simplify process steps.

What is claimed is:

1. A non-volatile semiconductor memory device comprising:
   a cell gate pattern in a cell array region, a high-voltage-type gate pattern in a peripheral high-voltage region, and a low-voltage-type gate pattern in a peripheral low-voltage region on a semiconductor substrate,
   wherein the high-voltage-type gate pattern includes a high-voltage gate insulating layer, a first conductive layer, a triple layer, and a second conductive layer, the triple layer including a tunneling insulating layer, a charge storage layer, and a blocking insulating layer,
   wherein the cell gate pattern includes the triple layer and the second conductive layer, and
   wherein the low-voltage-type gate pattern includes a low-voltage gate insulating layer, the first conductive layer, the triple layer, and the second conductive layer.

2. The device as claimed in claim 1, further comprising a resistor pattern in a resist region,
   wherein the resistor pattern includes at least the first conductive layer formed on an insulating layer for electrical isolation from the substrate.

3. The device as claimed in claim 2, wherein the insulating layer is a trench-type device isolation layer or the high-voltage gate insulating layer.

4. The device as claimed in claim 2, further comprising a contact plug formed over the resistor pattern wherein, the resistor pattern has a contact region including the high voltage gate insulating layer and the first conductive layer and a line region including the high-voltage gate insulating layer, the first conductive layer, the triple layer, and the second conductive layer, and
   wherein the contact plug formed over the resistor pattern is isolated from the second conductive layer in the contact region.

5. The device as claimed in claim 1, wherein the cell gate pattern, the high-voltage-type gate pattern, and the low-voltage-type gate pattern have an insulating spacer on their sidewalls.

6. The device as claimed in claim 1, wherein the second conductive layer is a dual layer comprising a lower layer of polysilicon and an upper layer of metal silicide.

7. The device as claimed in claim 1, further comprising a butting contact concurrently connected to the first and second conductive layers in the respective low-and high-voltage-type gate patterns.

8. The device as claimed in claim 1, wherein a top surface elevation of the triple layer is lower than a top surface elevation of a trench-type device isolation layer formed at the substrate in the cell array region, and
   wherein a bottom surface elevation of the triple layer is higher than a top surface elevation of the trench-type device isolation layer in the peripheral high-and low-voltage regions.

9. The device as claimed in claim 1, wherein the second conductive layer comprises a lower conductive layer and an upper conductive layer.

10. The device as claimed in claim 9, wherein the lower conductive layer is a polysilicon layer, and the upper conductive layer is a dual layer comprising a lower layer of polysilicon and an upper layer of metal silicide.

11. The device as claimed in claim 9, wherein a top surface elevation of the lower conductive layer is lower than a top surface elevation of a device isolation layer in a cell array region and in peripheral high-and low-voltage regions.

12. A non-volatile memory device comprising a cell gate pattern of a cell array region, a high-voltage-type gate pattern of a peripheral high-voltage region, and a low-voltage-type gate pattern of a peripheral low-voltage region on a semiconductor substrate,
   wherein the high-voltage-type gate pattern includes a high-voltage gate insulating layer, a first conductive layer, and a high-conductivity layer,
   wherein the cell gate pattern for a memory component includes a triple layer, a second conductive layer, and the high-conductivity layer, the triple layer including a tunneling insulating layer, a charge storage layer, and a blocking insulating layer, and
   wherein the low-voltage-type gate pattern includes a low-voltage gate insulating layer, the first conductive layer, and the high-conductivity layer.

13. The device as claimed in claim 12, further comprising a resistor region, and a resistor pattern in the resistor region,
   wherein the resistor pattern includes at least the first conductive layer that is formed on an insulating layer for electrical isolation from the substrate.

14. The device as claimed in claim 13, wherein the insulating layer is a trench-type device isolation layer or the high-voltage gate insulating layer.

15. The device as claimed in claim 13, further comprising:
   a contact plug formed over the resistor wherein the resistor pattern has a contact region including the gate insulating layer and the first conductive layer,
   wherein the resistor pattern has a line region including the gate insulating layer, the first conductive layer, the triple layer, the second conductive layer, and the high-conductivity layer,
   wherein the contact plug is formed in the contact region and is separated from the second conductive layer and the high-conductivity layer in the line region, and
   wherein in the line region the second conductive layer and the high-conductivity layer are isolated from the first conductive layer by the triple layer.

16. The device as claimed in claim 12, further comprising an insulating spacer formed on sidewalls of the cell gate pattern, the high-voltage-type gate pattern, and the low-voltage-type gate pattern.

17. The device as claimed in claim 12, wherein a top surface elevation of the triple layer is lower than a top surface elevation of the trench-type device isolation layer formed at the substrate in the cell array region, and wherein a top surface elevation of the first conductive layer is higher than a top surface elevation of the trench-type device isolation layer in the peripheral high-and low-voltage-type gate pattern regions.

18. The device as claimed in claim 12, further comprising a contact formed on the high-conductivity layer in a partial region of each of the cell gate pattern, the high-voltage-type gate pattern, and the low-voltage type gate pattern.

19. The device as claimed in claim 12, wherein the high-conductivity layer includes a metal silicide layer as the uppermost layer.

20. The device as claimed in claim 19, wherein the high-conductivity layer comprises a lower layer of polysilicon and an upper layer of metal silicide.

21. The device as claimed in claim 20, wherein in the cell array region, a top surface elevation of the trench-type device isolation layer formed over the substrate is higher than a top surface elevation of the second conductive layer and is lower than a top surface elevation of the polysilicon layer of the high-conductivity layer, and wherein in the high-and lower-voltage-type gate pattern regions, a top surface of the trench type device isolation layer is higher than a top surface elevation of the first conductive layer and is lower than a top surface elevation of the polysilicon layer of the high-conductivity layer.

22. The device as claimed in claim 20, further comprising a resistor pattern in a resist region, wherein the resistor pattern includes at least the first conductive layer and the polysilicon layer of the high-conductivity layer, the first conductive layer being formed on an insulating layer.

23. The device as claimed in claim 22, wherein the insulating layer is a trench-type device isolation layer or the high-voltage-type gate insulating layer.

24. The device as claimed in claim 22, wherein the resistor pattern has the high-voltage gate insulating layer, the first conductive layer, and the polysilicon layer of the high-conductivity layer.

25. The device as claimed in claim 22, wherein in the cell array region, a top surface elevation of the trench-type device isolation layer formed on the substrate is higher than a top surface elevation of the second conductive layer and is lower than a top surface elevation of the polysilicon layer of the high-conductivity layer, and wherein in the peripheral high-and low-voltage regions, a top surface elevation of the trench-type device isolation layer is higher than a top surface elevation of the first conductive layer and is lower than a top surface elevation of the polysilicon layer of the high-conductivity layer.

26. A non-volatile memory device comprising a cell gate pattern of a cell array region, a high-voltage-type gate pattern of a peripheral high-voltage region, and a low-voltage-type gate pattern and a line-type resistor pattern of a peripheral low-voltage region, wherein the high-voltage type gate pattern includes a high-voltage gate insulating layer, the conductive layer, a triple layer, a polysilicon layer, and a metal silicide layer, the triple layer including a tunneling insulating layer, a charge storage layer, and a blocking insulating layer, wherein the cell gate pattern for a memory component includes the triple layer, the polysilicon layer, and the metal silicide layer, wherein the low-voltage-type gate pattern includes a low-voltage gate insulating layer, a conductive layer, the triple layer, the polysilicon layer, and the metal silicide layer, wherein the resistor pattern has a line region and a contact region, the line region including the high-voltage gate insulating layer, the conductive layer, the triple layer, the polysilicon layer, and the metal silicide layer, and the contact region including the high-voltage gate insulating layer, and the conductive layer, wherein in the cell array region, a top surface elevation of the triple layer is lower than a top surface elevation of a trench-type device isolation layer formed over the substrate, and wherein in the peripheral high-and low-voltage regions, a bottom surface elevation of the triple layer is higher than a top surface elevation of the trench-type device isolation layer, the device further comprising:

an insulating spacer formed on sidewalls of the cell gate pattern, the high-voltage-type gate pattern, the low-voltage-type gate pattern, and the resistor pattern;

a butting contact concurrently connected to the conductive layer, the polysilicon layer, and the metal silicide layer in the contact region of the respective low-voltage-type gate pattern and high-voltage-type gate pattern;

a first contact plug formed on the metal silicide layer of the cell gate pattern; and a second contact plug formed on the conductive layer of the contact region of the resist pattern, wherein the metal silicide layer and the polysilicon layer of the line regions is isolated from the contact plug.

27. A non-volatile memory device comprising a cell gate pattern in a cell array region, a high-voltage-type gate pattern in a peripheral high voltage region, and a low-voltage-type gate pattern and a line type resistor pattern in a peripheral low voltage region, wherein the high-voltage-type gate pattern includes a high voltage gate insulating layer, a first conductive layer, a triple layer, a polysilicon layer, a metal silicide layer, the triple layer including a tunneling insulating layer, a charge storage layer, and a blocking insulating layer, wherein the cell gate pattern includes the triple layer, a second conductive layer, the polysilicon layer, and the metal silicide layer, wherein the low-voltage-type gate pattern includes a low voltage gate insulating layer, a conductive layer, the triple layer, the polysilicon layer, and the metal silicide layer, wherein the resistor pattern has a line region and a contact region, the line region including the high-voltage gate insulating layer, the first conductive layer, the triple layer the second conductive layer, the polysilicon layer, and the metal silicide layer, and the contact region including the high-voltage gate insulating layer, and the first conductive layer, wherein in the cell gate pattern region, a top surface elevation of the triple layer is lower than a top surface elevation of a trench-type device isolation layer formed over the substrate, and wherein in the high-and low-voltage-type gate pattern regions, a top surface elevation of the trench-type device isolation layer is higher than a top surface elevation of the second conductive layer and is lower than a top surface elevation of the polysilicon layer, the device further comprising:
- an insulating spacer formed on sidewalls of the gate pattern for a memory component, the high-voltage-type gate pattern, the low-voltage-type gate pattern, and the resistor pattern;
- a butting contact plug concurrently connected to the first conductive layer, the second conductive layer, the metal silicide layer, and the polysilicon layer by removal of the metal silicide layer, the polysilicon layer, the second conductive layer, and the triple layer in a part of the contact region in the respective low-and high-voltage-type gate patterns;
- a first contact plug connected to the metal silicide layer of the gate pattern for a memory component; and
- another contact plug formed in the contact region of the resistor pattern, the another contact plug not being in contact with the metal silicide layer, the polysilicon layer, and the second conductive layer.

* * * * *